US012775216B2

(12) United States Patent
Oh et al.

(10) Patent No.: US 12,775,216 B2
(45) Date of Patent: Oct. 27, 2026

(54) SEMICONDUCTOR PROCESS APPARATUS

(71) Applicant: Samsung Electronics Co., Ltd., Suwon-si (KR)

(72) Inventors: Kyoungwhan Oh, Suwon-si (KR); Donghyeong Kim, Suwon-si (KR); Eunhee Jeang, Suwon-si (KR); Iksun Park, Suwon-si (KR); Dahae Lee, Suwon-si (KR); Ohkug Kwon, Suwon-si (KR); Jeonggil Kim, Suwon-si (KR); Jinhyuk Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 76 days.

(21) Appl. No.: 18/888,268

(22) Filed: Sep. 18, 2024

(65) Prior Publication Data

US 2025/0237963 A1 Jul. 24, 2025

(30) Foreign Application Priority Data

Jan. 18, 2024 (KR) ........................ 10-2024-0008146
Aug. 23, 2024 (KR) ........................ 10-2024-0113716

(51) Int. Cl.
*G03F 7/00* (2006.01)

(52) U.S. Cl.
CPC .......... *G03F 7/702* (2013.01); *G03F 7/70033* (2013.01); *G03F 7/70091* (2013.01); *G03F 7/70191* (2013.01); *G03F 7/70233* (2013.01); *G03F 7/70525* (2013.01); *G03F 7/70716* (2013.01); *G03F 7/70975* (2013.01)

(58) Field of Classification Search
CPC .. G03F 7/702; G03F 7/70033; G03F 7/70091; G03F 7/70191; G03F 7/70233; G03F 7/70525; G03F 7/70716; G03F 7/70975
See application file for complete search history.

(56) References Cited

U.S. PATENT DOCUMENTS

| | | | |
|---|---|---|---|
| 9,134,620 | B2 | 9/2015 | Zimmerman |
| 9,304,406 | B2 | 4/2016 | Staicu et al. |
| 10,007,193 | B2 | 6/2018 | Patra et al. |
| 11,340,532 | B2 | 5/2022 | Ma et al. |
| 11,656,555 | B2 | 5/2023 | Nath et al. |
| 11,947,265 | B2 * | 4/2024 | Feldmann ........... G03F 7/70191 |

(Continued)

*Primary Examiner* — Hung V Nguyen
(74) *Attorney, Agent, or Firm* — Muir Patent Law, PLLC

(57) ABSTRACT

A semiconductor process apparatus includes an extreme ultraviolet (EUV) light source; a mask stage configured to support a mask; a substrate stage configured to support a substrate; an optical lighting system including a plurality of lighting mirrors configured to guide EUV light from the light source to the mask stage; an optical projection system including a plurality of projection mirrors configured to guide the EUV light from the mask stage to the substrate stage; a control unit configured to control the light source, the mask stage, the substrate stage, the optical lighting system, and the optical projection system; and an optical intensity adjuster configured to adjust the intensity of the EUV light. A first lighting mirror includes a plurality of unit mirrors, and the control unit is configured to measure a degree of degradation of each unit mirror and to replace at least one unit mirror.

19 Claims, 18 Drawing Sheets

(56) References Cited

U.S. PATENT DOCUMENTS

| | | | | |
|---|---|---|---|---|
| 12,140,877 | B2 * | 11/2024 | Ehm | G03F 7/705 |
| 2008/0149862 | A1 | 6/2008 | Hansson et al. | |
| 2012/0193547 | A1 | 8/2012 | Hansson et al. | |
| 2013/0208253 | A1 * | 8/2013 | Shim | G03F 7/702 355/67 |
| 2020/0249578 | A1 | 8/2020 | Hsu et al. | |
| 2022/0334503 | A1 | 10/2022 | Cui et al. | |
| 2022/0404718 | A1 | 12/2022 | Van Oosten | |
| 2023/0083834 | A1 | 3/2023 | Lyons et al. | |
| 2024/0319621 | A1 * | 9/2024 | Becker | G03F 7/70916 |

* cited by examiner

540

SEMICONDUCTOR PROCESS APPARATUS

CROSS-REFERENCE TO RELATED APPLICATION(S)

This application claims benefit of priority to Korean Patent Application No. 10-2024-0008146 filed on Jan. 18, 2024 and Korean Patent Application No. 10-2024-0113716 filed on Aug. 23, 2024, in the Korean Intellectual Property Office, the disclosure of which is incorporated herein by reference in its entirety.

BACKGROUND

Example embodiments in the example embodiment relate to a semiconductor process apparatus.

A semiconductor process may include a photo process, an etching process, a deposition process, and the like, to form a plurality of layers on a substrate, and a plurality of patterns may be formed in each of the plurality of layers. As a line width of a plurality of patterns and a distance thereof have been designed to be fine, a photolithography process using relatively short wavelength light, for example, extreme ultraviolet (EUV) light, has been suggested. A semiconductor process apparatus which performs a photolithography process using extreme ultraviolet light may include a plurality of mirrors reflecting extreme ultraviolet light. To improve and maintain a stable yield of a semiconductor process performed in a semiconductor process apparatus, it may be necessary to manage the quality of the extreme ultraviolet light irradiated to a substrate in the semiconductor process apparatus.

SUMMARY

An example embodiment of the present disclosure is to provide a semiconductor process apparatus that may stably manage the deterioration of lighting mirrors included in an optical lighting system which allows extreme ultraviolet light to travel to a mask, and/or provide a semiconductor process apparatus that may stably manage light loss and distribution of light intensity in a projection optical system that reflects extreme ultraviolet light from the mask to a substrate.

According to an example embodiment of the present disclosure, a semiconductor process apparatus includes an extreme ultraviolet light source configured to output extreme ultraviolet light within an extreme ultraviolet wavelength band; a mask stage configured to support a mask configured to reflect extreme ultraviolet light in a pattern to result in patterned extreme ultraviolet light; a substrate stage configured to support a substrate, wherein the substrate stage is configured to position a substrate supported by the substrate stage to be irradiated by the patterned extreme ultraviolet light reflected from the mask; an optical lighting system including a plurality of lighting mirrors configured to guide the extreme ultraviolet light from the extreme ultraviolet light source to the mask stage; an optical projection system including a plurality of projection mirrors configured to guide the patterned extreme ultraviolet light from the mask stage to the substrate stage; a control unit configured to control the light source, the mask stage, the substrate stage, the optical lighting system, and the optical projection system; and an optical intensity adjuster disposed between the mask stage and the optical projection system and configured to adjust the intensity of the patterned extreme ultraviolet light, wherein, among the plurality of lighting mirrors, a first lighting mirror includes a plurality of unit mirrors, and the control unit is configured to measure a degree of degradation of each unit mirror of the plurality of unit mirrors and to respectively replace at least one unit mirror of the plurality of unit mirrors with at least one other unit mirror, and wherein the control unit is configured to determine an extreme ultraviolet light loss of the optical projection system by measuring an intensity of the extreme ultraviolet light that is incident to the optical projection system and the intensity of the extreme ultraviolet light emitted from the optical projection system in a state in which an offset of the optical intensity adjuster is initialized.

According to an example embodiment of the present disclosure, a semiconductor process apparatus includes a light source configured to output extreme ultraviolet light within an extreme ultraviolet wavelength band; a mask stage configured to support a mask that is configured to reflect extreme ultraviolet light in a pattern to result in patterned extreme ultraviolet light; a substrate stage configured to support a substrate; an optical lighting system including a first lighting mirror and a second lighting mirror configured to guide the extreme ultraviolet light from the light source to the mask stage, wherein the first lighting mirror includes a plurality of unit mirrors, a portion of which includes selected unit mirrors configured to reflect the extreme ultraviolet light; and a control unit configured to control the light source, the mask stage, the substrate stage, and the optical lighting system, wherein the control unit is configured to measure a degree of degradation of each unit mirror in the plurality of unit mirrors, select unit mirrors disposed in a reflective area for reflecting the extreme ultraviolet light from the first lighting mirror, and to select a unit mirror from a non-reflective area different from the reflective area to replace at least one of the selected unit mirrors disposed in the reflective area.

According to an example embodiment of the present disclosure, a semiconductor process apparatus includes a lighting unit configured to output extreme ultraviolet light within an extreme ultraviolet wavelength band; a mask stage configured to support a mask configured to reflect the extreme ultraviolet light in a pattern to result in patterned extreme ultraviolet light; a substrate stage configured to support a substrate, wherein the substrate stage is positioned such that patterned extreme ultraviolet light reflected by a mask supported on the mask stage is irradiated to a substrate supported by the substrate stage; an optical projection system including a plurality of projection mirrors configured to guide the patterned extreme ultraviolet light from the mask stage to the substrate stage; an optical intensity adjuster disposed between the optical projection system and the mask stage and configured to adjust an intensity of patterned extreme ultraviolet light that is incident to the optical projection system; and a control unit configured to control the lighting unit, the mask stage, the substrate stage, and the optical projection system, wherein the optical intensity adjuster includes a plurality of unit structures, and wherein the control unit is configured to determine an extreme ultraviolet light loss of the optical projection system by measuring the intensity of extreme ultraviolet light that is incident to the optical projection system and the intensity of the extreme ultraviolet light emitted from the optical projection system to the substrate stage in a state in which the plurality of unit structures is initialized.

BRIEF DESCRIPTION OF DRAWINGS

These and other aspects, features, and advantages in the example embodiment will be more clearly understood from the following detailed description, taken in combination with the accompanying drawings, in which.

DETAILED DESCRIPTION

Figure 1:
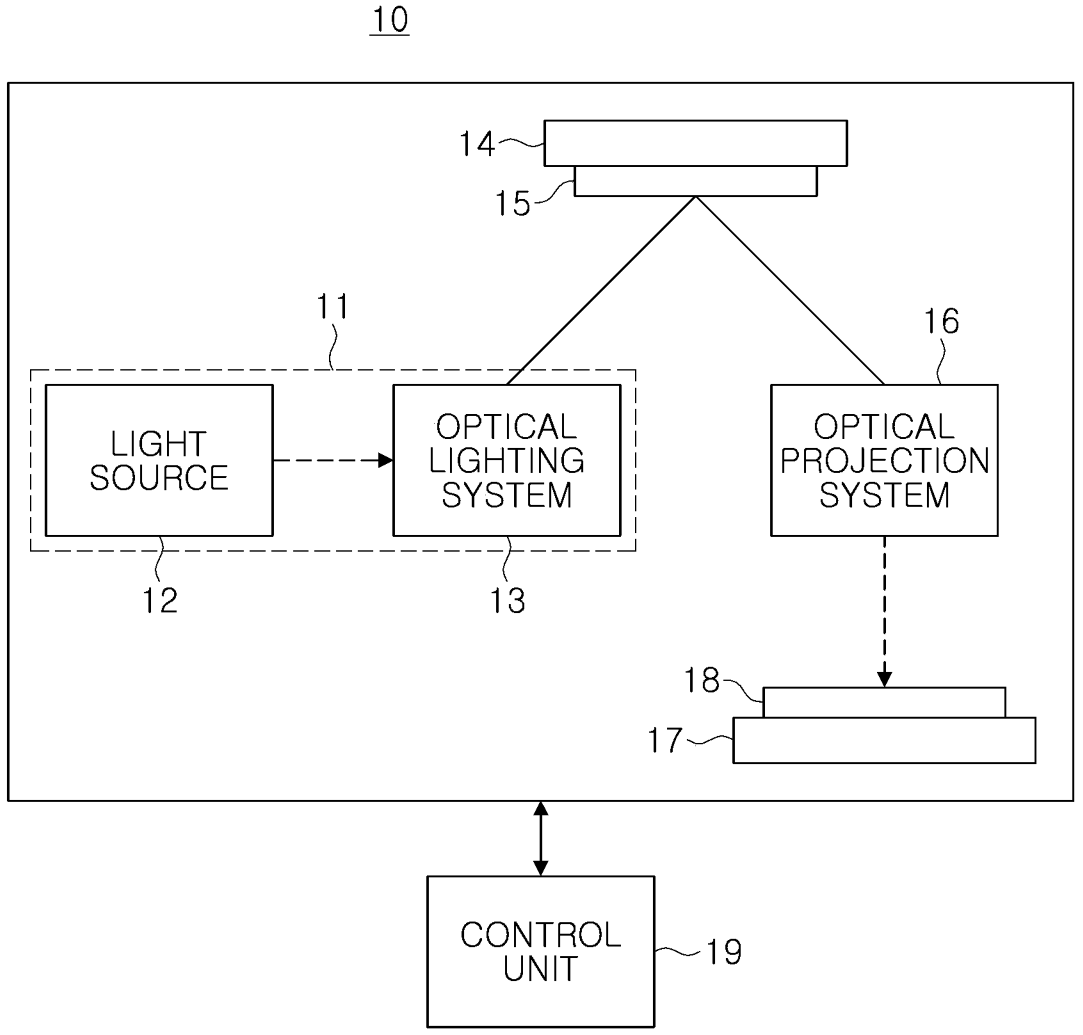
FIGS. 1 and 2 are diagrams illustrating a semiconductor process apparatus according to an example embodiment of the present disclosure.

The present disclosure will be described more fully hereinafter with reference to the accompanying drawings, in which various embodiments are shown. The inventive concept may, however, be embodied in many different forms and should not be construed as limited to the example embodiments set forth herein. Furthermore, any consistency of detail between various examples should not be interpreted as requiring such detail. The language of the claims should be referenced in determining the requirements of the invention.

Items described in the singular herein may be provided in plural, as can be seen, for example, in the drawings. Thus, the description of a single item that is provided in plural should be understood to be applicable to the remaining plurality of items unless context indicates otherwise.

Figure 2:
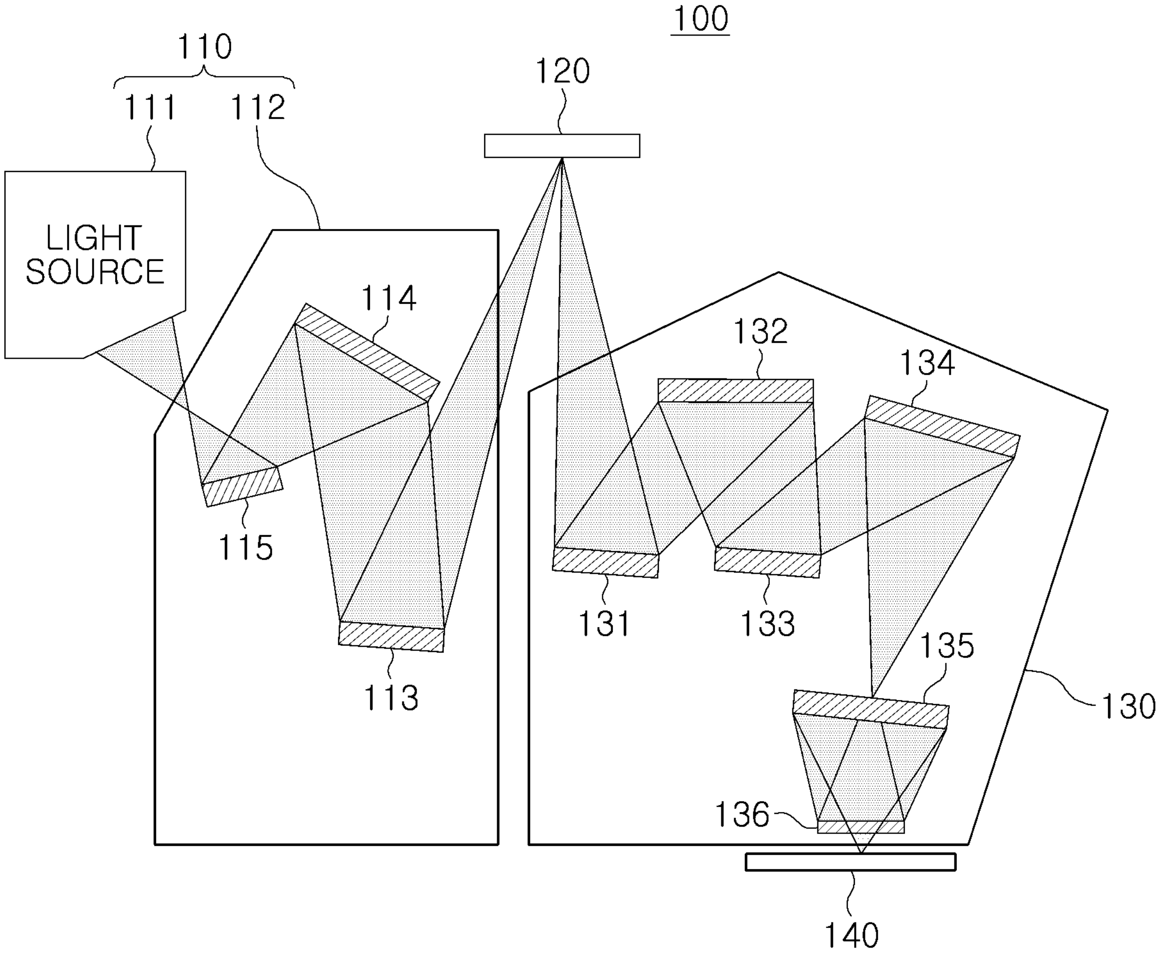

FIGS. 1 and 2 are diagrams illustrating a semiconductor process apparatus according to an example embodiment.

Referring to FIG. 1, a semiconductor process apparatus 10 according to an example embodiment may be configured to perform a photolithography process and may include a lighting unit 11, a mask stage 14, an optical projection system 16, a substrate stage 17, and a control unit 19.

The lighting unit 11 may include an extreme ultraviolet light source 12, which may also be referred to as a "light source", and an optical lighting system 13. The light source 12 may generate and emit extreme ultraviolet light, which may also be referred to as "light", having a high energy density within a wavelength band range of several nanometers to tens of nanometers. In the example embodiment, the light source 12 may generate and output extreme ultraviolet light having high energy density in a 13.5 nm wavelength band. The light source 12 may include a plasma-based light source or a synchrotron radiation light source.

For example, the light source 12 may output extreme ultraviolet light using plasma. The light source may operate by a laser-produced plasma (LPP) method, which generates plasma by irradiating a high-power laser to a droplet formed from materials such as tin, lithium, and xenon, or by a discharge-produced plasma (DPP) method, or May operate by a discharge-produced plasma (DPP) method, or by a master oscillator power amplifier (MOPA) method. The light source may produce the extreme ultraviolet light having a predefined beam shape according to a pupil of the light source. When a distribution of the extreme ultraviolet light is viewed in a plane perpendicular to the extreme ultraviolet light axis, the predefined beam shape may appear as one or more rings, segments of or more rings, or other shapes. This will be described in more detail with reference to FIG. 5.

The high-power laser may form plasma by colliding with droplets supplied by a droplet supply unit, and accordingly, a lighting mirror and a collector to refocus extreme ultraviolet light formed and/or produced by the plasma may be included in the light source 12. The collector may function as a reflector and may be disposed close to a droplet to increase refocus efficiency. The energy density of the extreme ultraviolet light output by the light source 12 may be increased by the lighting mirror and the collector.

The optical lighting system 13 may include a plurality of lighting mirrors. In the semiconductor process apparatus 10 according to the example embodiment, the optical lighting system 13 may include two or more lighting mirrors. The optical lighting system 13 may deliver extreme ultraviolet light emitted by the light source 12 to the mask stage 14. Extreme ultraviolet light emitted by the light source 12 may be reflected by the lighting mirrors included in the optical lighting system 13 and may be incident to a mask 15 disposed on the mask stage 14. The mask stage 14 may be configured to support a mask 15 thereon. For example, the mask stage 14 may have a planar surface for supporting the mask 15.

In the example embodiment, the mask 15 may be configured as a reflective mask including a non-reflective area and/or an intermediate reflective area along with a reflective area. A pattern formed by the non-reflective area and/or an intermediate reflective area along with a reflective area may be referred to as a mask pattern. The mask 15 may include a reflective multilayer film for reflecting extreme ultraviolet light to a substrate. The reflective multilayer film may be formed of a low thermal expansion coefficient material (LTEM), such as quartz, and an absorbing layer pattern formed on the reflective multilayer film. The reflective multilayer film may have a structure in which layers formed of different materials are laminated. The absorbing layer may be formed of TaN, TaNO, TaBO, Ni, Au, Ag, C, Te, Pt, Pd, or Cr. However, the material of the absorbing layer is not limited to the materials mentioned above, and the absorbing layer portion may correspond to the non-reflective area and/or the intermediate reflective area described above.

The mask 15 may reflect extreme ultraviolet light incident from the optical lighting system 13 and may reflect the extreme ultraviolet light to be incident to an optical projection system 16. The optical projection system 16 may be configured to be disposed between the mask stage 14 and the substrate stage 17. For example, extreme ultraviolet light passing through the optical lighting system 13 may be reflected from the mask 15 to result in patterned extreme ultraviolet light corresponding to the mask pattern included in the reflective multilayer film and the absorbing layer on the substrate in the mask 15. The reflected, patterned extreme ultraviolet light may be incident to the optical projection system 16.

The patterned extreme ultraviolet light passing through the optical projection system 16 may include at least secondary diffracted light based on the pattern on the mask 15. The patterned extreme ultraviolet light reflected from the mask 15 may be incident to the optical projection system 16 while including information from the mask pattern included in the mask 15. The patterned extreme ultraviolet light may be irradiated to the substrate 18 disposed on the substrate stage 17 through the optical projection system 16 such that an image corresponding to the mask pattern included in the mask 15 may be formed on the substrate 18. For example, the patterned extreme ultraviolet light may be irradiated to a photoresist layer applied on the substrate 18 and may form a predetermined pattern in the photoresist layer. In example embodiments, the patterned extreme ultraviolet light corresponding to the mask pattern after passing through the optical projection system 16 may be incident to a process object other than the substrate 18.

The patterned extreme ultraviolet light reflected from the mask 15 and passing through the optical projection system 16 may be incident to an upper surface of the substrate 18 while forming a predetermined slope with respect to the upper surface. For example, the optical projection system 16 may adjust the traveling path of the patterned extreme ultraviolet light such that the patterned extreme ultraviolet light may be incident to the upper surface of the substrate 18 with an incident angle of about 6 degrees.

The mask 15 may be disposed on the mask stage 14, and the substrate 18 may be disposed on the substrate stage 17. The position and the orientation of the mask stage 14 and the substrate stage 17 may be controlled by the control unit 160. In an initial state in which the mask 15 and the substrate 18 are disposed on the mask stage 14 and the substrate stage 17, respectively, the upper surface of the mask 15 and the substrate 18 may be defined as X-Y planes. Each of the mask stage 14 and the substrate stage 17 may move under the control of the control unit 160. For example, each of the substrate stage 17 and the mask stage 14 may be mounted with at least one linear bearing to a base structure to allow for translational movement. A motor or actuator may be controlled by the control unit 160 to cause the substrate stage 17 or the mask stage 14 to move. In an example embodiment, each of the mask stage 14 and the substrate stage 17 may be mounted with at least one rotational bearing to the base structure to allow the mask stage 14 or the substrate stage 17 to rotate relative to the base structure. At least one motor or rotary actuator may cause the mask stage 14 and/or the substrate stage 17 to rotate relative to the base structure. The motor or actuator may be controlled by the control unit 160 to control a rotation of each of the mask stage 14 and the substrate stage 17 on the X-Y plane about a Z-axis, or on a Y-Z plane or an X-Z plane about any axis on the X-Y plane. By moving the mask stage 14 and/or the substrate stage 17 as described above, the mask 15 and/or the substrate 18 may move or rotate along the x-axis, the y-axis, and the Z-axis in a three-dimensional space.

The optical projection system 16 may include a plurality of projection mirrors. Each of the projection mirrors included in the optical projection system 16 may include a mirror body and a reflective layer attached to a surface of the mirror body. As described above, extreme ultraviolet light passing through the optical lighting system 13 and reflected from the mask 15 may correspond to the mask pattern and may be incident to the optical projection system 16, and accordingly, each of the projection mirrors may reflect the extreme ultraviolet light corresponding to the mask pattern.

Since the extreme ultraviolet light has a predetermined beam shape in the optical lighting system 13, the extreme ultraviolet light may be reflected only in a portion of the total reflective area of at least one of the lighting mirrors included in the optical lighting system 13. Accordingly, in at least one lighting mirror, contamination or degradation may worsen only a portion of the total area of the at least one lighting mirror, which may lead to a decrease in the lifespan of the optical lighting system 13 and an increase in maintenance costs of the semiconductor process apparatus 10.

In example embodiments, each of the lighting mirrors included in the optical lighting system 13 may include a plurality of unit mirrors which may each have a posture that may be individually adjusted. Because the extreme ultraviolet light has the predetermined beam shape, the extreme ultraviolet light may be reflected only from selected unit mirrors which may be only a portion of the plurality of unit mirrors, in at least one lighting mirror. Accordingly, when contamination of selected unit mirrors accelerates, non-selected unit mirrors may be maintained in a desirable condition.

In an example embodiment, the control unit 19 may measure the degree of degradation caused by contamination of selected unit mirrors and may control the optical lighting system 13 based on the results of the measurement. For example, the control unit 19 may replace the selected unit mirror which has been determined as severely degraded among the selected unit mirrors with a non-selected unit mirror. Accordingly, maintenance costs may be lowered and the lifespan of the optical lighting system 13 may improve.

The control unit may be a logic controller or computing system and may include, for example, one or more processors configured to execute computer program instructions to perform various processes and methods, random access memory (RAM) and read only memory (ROM) configured to access and store data and information and computer program instructions, input/output (I/O) devices configured to provide input and/or output to the processing controller (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, the control unit can include a power source that provides an appropriate alternating current (AC) or direct current (DC) to power one or more components of the controller, and a bus that allows communication among the various disclosed components of the controller. The input/output (I/O) devices may interact with sensors and actuators of the semiconductor process apparatus 100.

In an example embodiment, the control unit 19 may determine light loss of the optical projection system 16 by measuring the intensity of each of the patterned extreme ultraviolet light incident to the optical projection system 16

(incident extreme ultraviolet light) and the patterned extreme ultraviolet light that is emitted by the optical projection system 16 (emitted extreme ultraviolet light) using sensors. For example, emitted extreme ultraviolet light of the optical projection system 16 may have a line-shaped pattern extending in one direction, and an optical intensity adjuster for reducing the difference in the intensity of emitted extreme ultraviolet light in one direction may be disposed between the optical projection system 16 and the mask stage 14. The optical intensity adjuster may adjust the intensity of the incident extreme ultraviolet light reflected from the mask 15 and traveling to the optical projection system 16 in the one direction.

In an example embodiment, the control unit 19 may measure the difference in intensity between incident extreme ultraviolet light and emitted extreme ultraviolet light of the optical projection system 16 while initializing the optical intensity adjuster. The control unit 19 may determine extreme ultraviolet light loss of the optical projection system 16 based on the measurement. Accordingly, by excluding the influence of the optical intensity adjuster, extreme ultraviolet light loss of the optical projection system 16 may be accurately determined. Also, the control unit 19 may optimally set the intensity of the extreme ultraviolet light incident to the substrate 18 by adjusting the optical intensity adjuster with reference to the light loss of the optical projection system 16.

Referring to FIG. 2, the semiconductor process apparatus 100 according to an example embodiment may include a lighting unit 110, a mask stage 120, an optical projection system 130, and a substrate stage 140. The lighting unit 110 may include a light source 111 and an optical lighting system 112. The light source 111 may generate and emit extreme ultraviolet light having a high energy density within a wavelength band range of several nanometers to tens of nanometers as described with reference to FIG. 1 above.

The optical lighting system 112 may include a first lighting mirror 113, a second lighting mirror 114 and a third lighting mirror 115, and the extreme ultraviolet light output by the light source 111 may be reflected from the first lighting mirror 113, the second lighting mirror 114 and the third lighting mirror 115 and may travel to the mask stage 120. The first lighting mirror 113 may be configured to reflect and output the extreme ultraviolet light to the mask stage 120, and the second lighting mirror 114 may be configured to reflect the extreme ultraviolet light and to guide the reflected extreme ultraviolet light to the first lighting mirror 113. The extreme ultraviolet light output by the light source 111 may be reflected from the third lighting mirror 115 and may travel to the second lighting mirror 114.

In an example embodiment, each of the first lighting mirror 113 and the second lighting mirror 114 may include a plurality of unit mirrors, and the posture of each of the plurality of unit mirrors may be individually adjusted. In an example embodiment, the posture of each of the plurality of unit mirrors may be adjusted by a 6-axis gyro module. The 6-axis gyro module may include at least one actuator controlled by the control unit to alter the posture of each of the plurality of unit mirrors.

In an example embodiment, the extreme ultraviolet light may be reflected from the front surface of the second lighting mirror 114, and the extreme ultraviolet light reflected from the second lighting mirror 114 may be reflected from a portion of an area of the first lighting mirror 113 and travel to the mask stage 120. Accordingly, the degree of degradation exhibited in the unit mirrors of the second lighting mirror 114 may not have a significant difference therebetween, but the degree of degradation exhibited in the unit mirrors of the first lighting mirror 113 may have a relatively large difference therebetween. For example, among the unit mirrors of the first lighting mirror 113, there may be a relatively large difference between the degree of degradation of the unit mirror disposed in the reflective area of extreme ultraviolet light and the degree of degradation of the unit mirror not disposed in the reflective area.

In an example embodiment, as the cumulative time spent performing the semiconductor process in the semiconductor process apparatus 100 increases, the reflective area of the first lighting mirror 113 from which extreme ultraviolet light is reflected may be changed. For example, the reflective area may be changed by replacing at least one unit mirror having a high degree of degradation among the unit mirrors disposed in the reflective area with a unit mirror not disposed in the reflective area. In this case, the second lighting mirror 114 may be adjusted together with the new unit mirror such that the intensity and/or the pattern of the extreme ultraviolet light traveling to the mask stage 120 may not change regardless of changes in the reflective area (e.g., the unit mirrors of the second light mirror 114 may be adjusted to compensate for the new unit mirror in the first lighting mirror 113). Each of the lighting mirrors may be adjusted by altering the posture of their respective unit mirrors to change the angle of incidence for a respective unit mirror to alter the direction of the reflected extreme ultraviolet light.

The extreme ultraviolet light reflected from the mask of the mask stage 120 may pass through the optical projection system 130 and may travel to the substrate stage 140, and the plurality of projection mirrors 131-136 included in the optical projection system 130 may reflect the extreme ultraviolet light. In the example embodiment illustrated in FIG. 2, the optical projection system 130 may include six projection mirrors 131-136, and the projection mirrors 131-136 may be disposed symmetrically with respect to an optical axis 137 of the optical projection system 130. However, the number of projection mirrors 131-136 included in the optical projection system 130 may be less or more than the example embodiment illustrated in FIG. 2.

The intensity of the emitted extreme ultraviolet light emitted from the optical projection system 130 and incident to the substrate stage 140 may be weaker than the intensity of the incident extreme ultraviolet light traveling to the optical projection system 130 which was reflected from the mask. For example, an optical detector for measuring the intensity of the incident extreme ultraviolet light may be disposed between the optical projection system 130 and the mask stage 120, and an optical detector for measuring the intensity of the emitted extreme ultraviolet light may be disposed between the optical projection system 130 and the substrate stage 140. When the intensity of the emitted extreme ultraviolet light is extremely low as compared to the intensity of the incident extreme ultraviolet light, operations such as increasing the output of the light source 111 or replacing the light source 111 with another light source having a higher output may be performed.

Emitted extreme ultraviolet light having passed through the optical projection system 130 may have a predetermined pattern, and an optical intensity adjuster for maintaining the intensity of emitted extreme ultraviolet light uniformly within the pattern may be provided. For example, the optical intensity adjuster may be provided between the mask stage 120 and the optical projection system 130. Since extreme ultraviolet light, the intensity of which has been adjusted by the optical intensity adjuster, is incident to the optical projection system 130, the result of detecting the intensity of incident extreme ultraviolet light and/or emitted extreme ultraviolet light of the optical projection system 130 may reflect the influence of the optical intensity adjuster.

In an example embodiment, to accurately measure the loss of extreme ultraviolet light by the optical projection system 130, each of the intensity of the incident extreme ultraviolet light and the intensity of the emitted extreme ultraviolet light may be measured in a state in which the optical intensity adjuster is initialized. Accordingly, extreme ultraviolet light loss characteristics of the optical projection system 130 may be accurately determined. Also, in an example embodiment, the optical intensity adjuster may be adjusted based on the results of measuring the intensity of incident extreme ultraviolet light and the intensity of emitted extreme ultraviolet light in a state in which the optical intensity adjuster is initialized. By adjusting the optical intensity adjuster based on accurate results of measurement for the intensity of the incident extreme ultraviolet light and the emitted extreme ultraviolet light, the quality of the extreme ultraviolet light irradiated to the substrate of the substrate stage 140 may be optimized.

Figure 3:
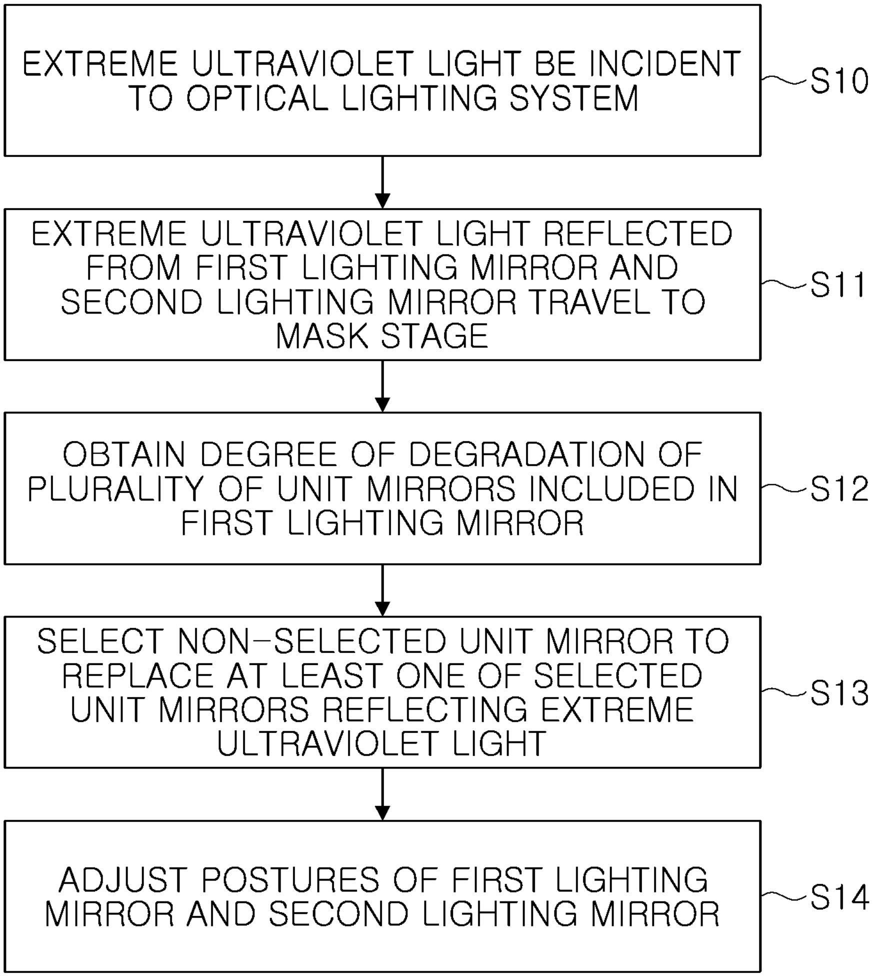
FIG. 3 is a flowchart illustrating operations of a semiconductor process apparatus according to an example embodiment of the present disclosure.

FIG. 3 is a flowchart illustrating operation of a semiconductor process apparatus according to an example embodiment.

Referring to FIG. 3, in an operation of a semiconductor process apparatus according to an example embodiment, extreme ultraviolet light may be provided to be incident to an optical lighting system (S10). The extreme ultraviolet light may be generated by a light source, and as described above, the light source may generate the extreme ultraviolet light having a high energy density in a wavelength band of several nanometers to tens of nanometers.

The extreme ultraviolet light incident to the optical lighting system may travel to the mask stage after being reflected from a first lighting mirror and a second lighting mirror (S11). The number of the lighting mirrors included in the optical lighting system may be varied in example embodiments, and the first lighting mirror may be configured to reflect the extreme ultraviolet light and output the reflected extreme ultraviolet light to the mask stage. The second lighting mirror may be configured to reflect the extreme ultraviolet light reflected from the first lighting mirror.

While the optical lighting system receives the extreme ultraviolet light from the light source and outputs the extreme ultraviolet light to the mask stage, a semiconductor process using the extreme ultraviolet light may be performed. The control unit, which is configured to control the semiconductor process apparatus, may obtain the degree of degradation of each of the unit mirrors included in the first lighting mirror under predetermined conditions (S12). The condition for executing operation S12 may refer to a condition in which the semiconductor process starts and a predetermined time elapses in the example embodiment.

For example, the extreme ultraviolet light incident to an optical lighting system may be reflected from the front surface of the second lighting mirror and from a portion of a selected area of the first lighting mirror. Accordingly, a difference in the degree of degradation of each of the unit mirrors included in the first lighting mirror may be greater than a difference in the degree of degradation of each of the unit mirrors included in the second lighting mirror. For example, the selected unit mirrors in the reflective area reflecting the extreme ultraviolet light from the first lighting mirror may degrade faster than the non-selected unit mirrors included in a non-reflective area that is not reflecting extreme ultraviolet light.

The control unit may select a non-selected unit mirror to replace at least one of the selected unit mirrors with reference to the degree of degradation obtained in operation S12 (S13). To replace an N number of selected unit mirrors (where N is a natural number) in operation S13, an N number of non-selected unit mirrors may be selected. Alternatively, in example embodiments, to maintain the same format of extreme ultraviolet light output by the optical lighting system, M number of non-selected unit mirrors may be selected to replace N number of selected unit mirrors (where N is a natural number) in an operation.

The control unit may adjust the postures of the first lighting mirror and the second lighting mirror based on the selection carried out in operation S13 (S14). The control unit may, by changing the posture of at least a portion of the plurality of unit mirrors included in the first lighting mirror and a portion of the plurality of unit mirrors included in the second lighting mirror, replace at least one selected unit mirror having a high degree of degradation among the selected unit mirrors included in the reflective area of the first lighting mirror with at least one non-selected unit mirror included in the non-reflective area of the first lighting mirror. Accordingly, the lifespan of the lighting mirrors may be extended, and the costs required for maintenance of the optical lighting system and the semiconductor process apparatus may be reduced.

Figure 4:
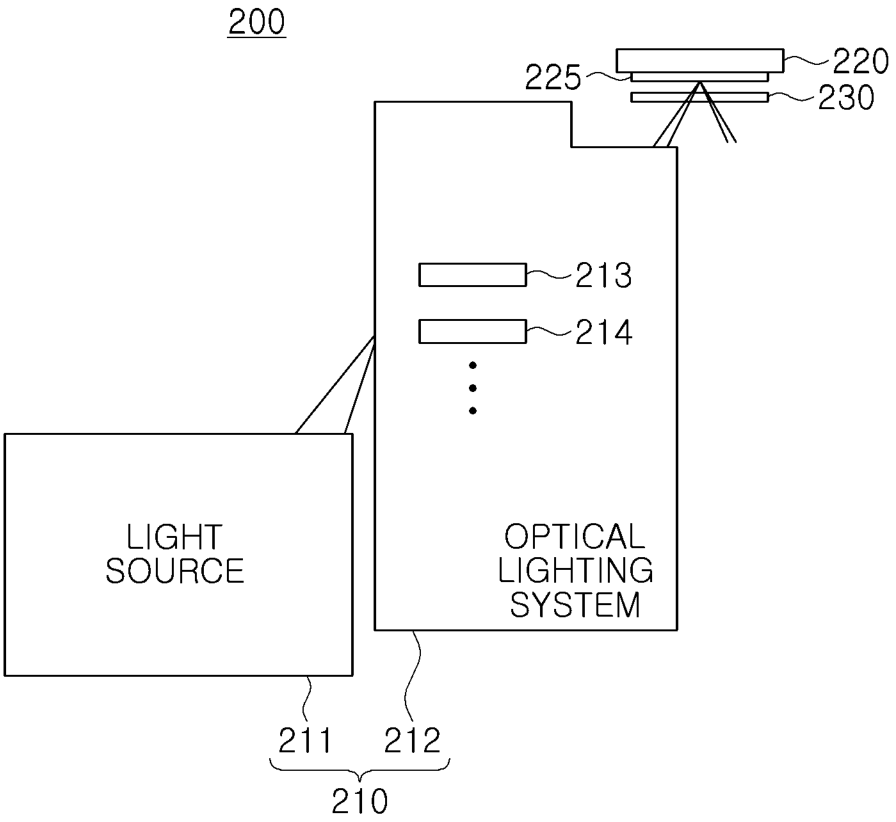
FIG. 4 is a diagram illustrating operations of a semiconductor process apparatus according to an example embodiment of the present disclosure.
Figure 5A:
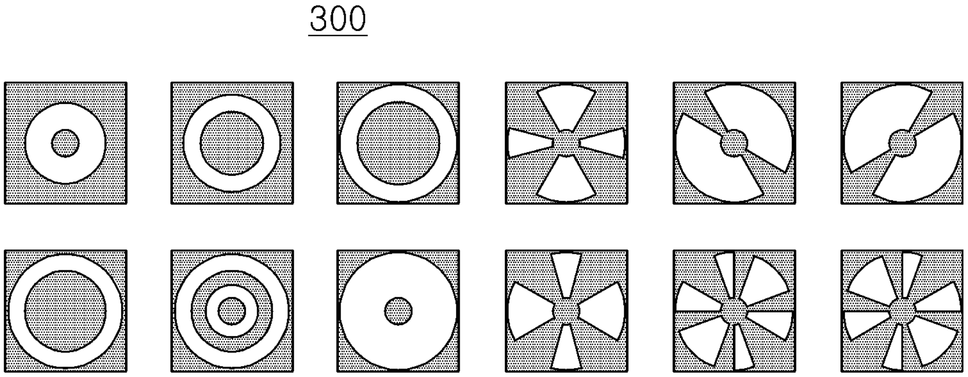
FIGS. 5A and 5B are diagrams illustrating extreme ultraviolet light generated in a semiconductor process apparatus according to an example embodiment of the present disclosure.
Figure 5B:
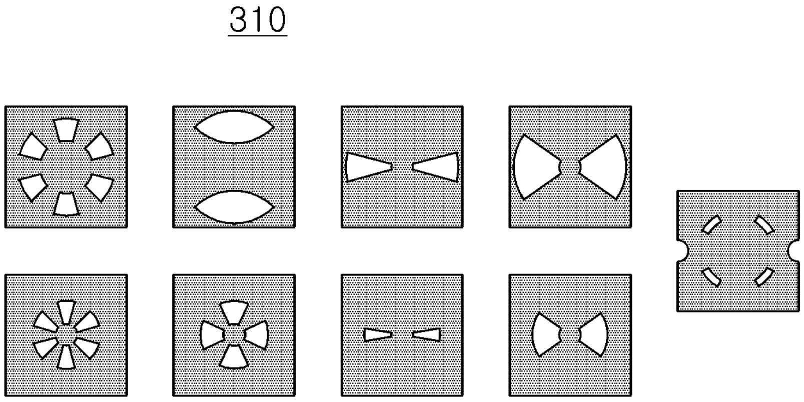

FIG. 4 is a diagram illustrating the operation of a semiconductor process apparatus according to an example embodiment. FIGS. 5A and 5B are diagrams illustrating extreme ultraviolet light generated in a semiconductor process apparatus according to an example embodiment.

Referring to FIG. 4, the semiconductor process apparatus 200 according to an example embodiment may include a lighting unit 210, a mask stage 220, and an optical adjuster 230. The lighting unit 210 may include a light source 211 and an optical lighting system 212, and extreme ultraviolet light output by the light source 211 may be reflected from the first lighting mirror 213 and the second lighting mirror 214 and may travel to a mask 225 disposed on a mask stage 220.

Each of the first lighting mirror 213 and the second lighting mirror 214 may include unit mirrors of which the posture of each unit mirror may be individually adjusted. In an example embodiment, the number of a plurality of first unit mirrors included in the first lighting mirror 213 may be different from the number of a plurality of second unit mirrors included in the second lighting mirror 214. For example, the number of the plurality of second unit mirrors included in the second lighting mirror 214 may be less than the number of the plurality of first unit mirrors included in the first lighting mirror 213.

In an example embodiment, the extreme ultraviolet light may be reflected from the front surface of the second lighting mirror 214 and may only be reflected from a portion of a reflective area of the first lighting mirror 213. For example, a ratio of a number of second unit mirrors reflecting extreme ultraviolet light to a total number of the plurality of second unit mirrors may be higher than a ratio of a number of first unit mirrors reflecting extreme ultraviolet light to a total number of the plurality of first unit mirrors. As the extreme ultraviolet light is reflected in the optical lighting system 212, the extreme ultraviolet light may be formatted into a predetermined pattern and may be incident to the mask 225. Hereinafter, the extreme ultraviolet light generated by the optical lighting system 212 will be described in greater detail with reference to FIGS. 5A and 5B.

FIGS. 5A and 5B illustrate beams of extreme ultraviolet light 300 and 310 having various predetermined shapes depending on parameters such as a pupil fill ratio (PFR) and resolution. The PFR in the example embodiment illustrated in FIG. 5A may be higher than the PFR in the example embodiment illustrated in FIG. 5B. As illustrated in FIGS. 5A and 5B, the beams of extreme ultraviolet light 300 and 310 output by the optical lighting system may have a predetermined shape on a plane perpendicular to an optical axis, and at least one of the lighting mirrors included in the optical lighting system, for example, in the case of the first lighting mirror 213 which reflects the extreme ultraviolet light last within the optical lighting system, the extreme ultraviolet light may be irradiated only to a portion of the reflective area.

Accordingly, the degree of degradation of each of the plurality of first unit mirrors included in the first lighting mirror 213 may vary depending on the predetermined shapes of the beams of extreme ultraviolet light 300 and 310. When the semiconductor process is continuously performed without considering the degree of degradation of each of the plurality of first unit mirrors, the first lighting mirror 213 may need to be replaced due to degradation of a portion of the plurality of first unit mirrors having continuously reflected the beams of extreme ultraviolet light 300 and 310, which may lead to an increase in maintenance costs of the semiconductor process apparatus 200, and the semiconductor process may need to be ceased, yield and productivity of the overall semiconductor process may be adversely affected.

In an example embodiment, the degree of degradation of each of the unit mirrors included in the reflective area configured to reflect the beams of extreme ultraviolet light 300 and 310 may be measured, and only the unit mirrors having a severe degree of degradation may be replaced with another unit mirror in the non-reflective area. In this case, in order to not change the patterns of the beams of extreme ultraviolet light 300 and 310 even though the unit mirror in the reflective area is replaced with the unit mirror in the non-reflective area, the other lighting mirrors included in the optical lighting system, for example, the second lighting mirror 214, may be adjusted together along with the first lighting mirror 213.

To measure the degree of degradation of each of the plurality of first unit mirror included in the first lighting mirror 213, the number of times each first unit mirror is used and the time of use of each first unit mirror may be used. Also, by removing an influence caused by the degradation of the second lighting mirror 214 reflecting extreme ultraviolet light prior to the first lighting mirror 213, the degree of degradation of each first unit mirror of the first lighting mirror 213 may be accurately measured.

By replacing unit mirrors having severe degradation with unit mirrors having less degradation, the lifespan of the optical lighting system 212 including the first lighting mirror 213 may be increased. Accordingly, the costs of maintenance of the semiconductor process apparatus 200 may be lowered, and the yield and productivity of the semiconductor process may also be improved.

Figure 6:
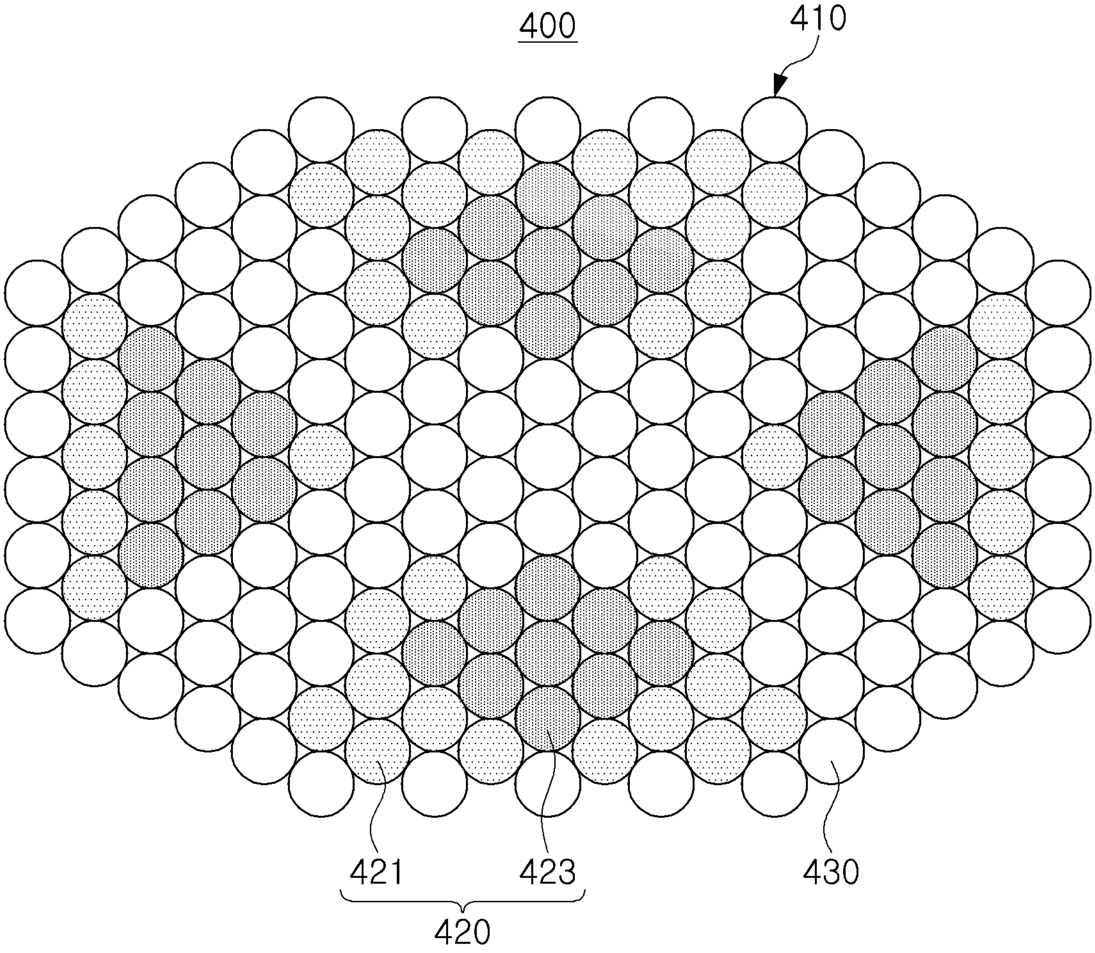
FIGS. 6 and 7 are diagrams illustrating operations of a semiconductor process apparatus according to an example embodiment of the present disclosure.
Figure 7:
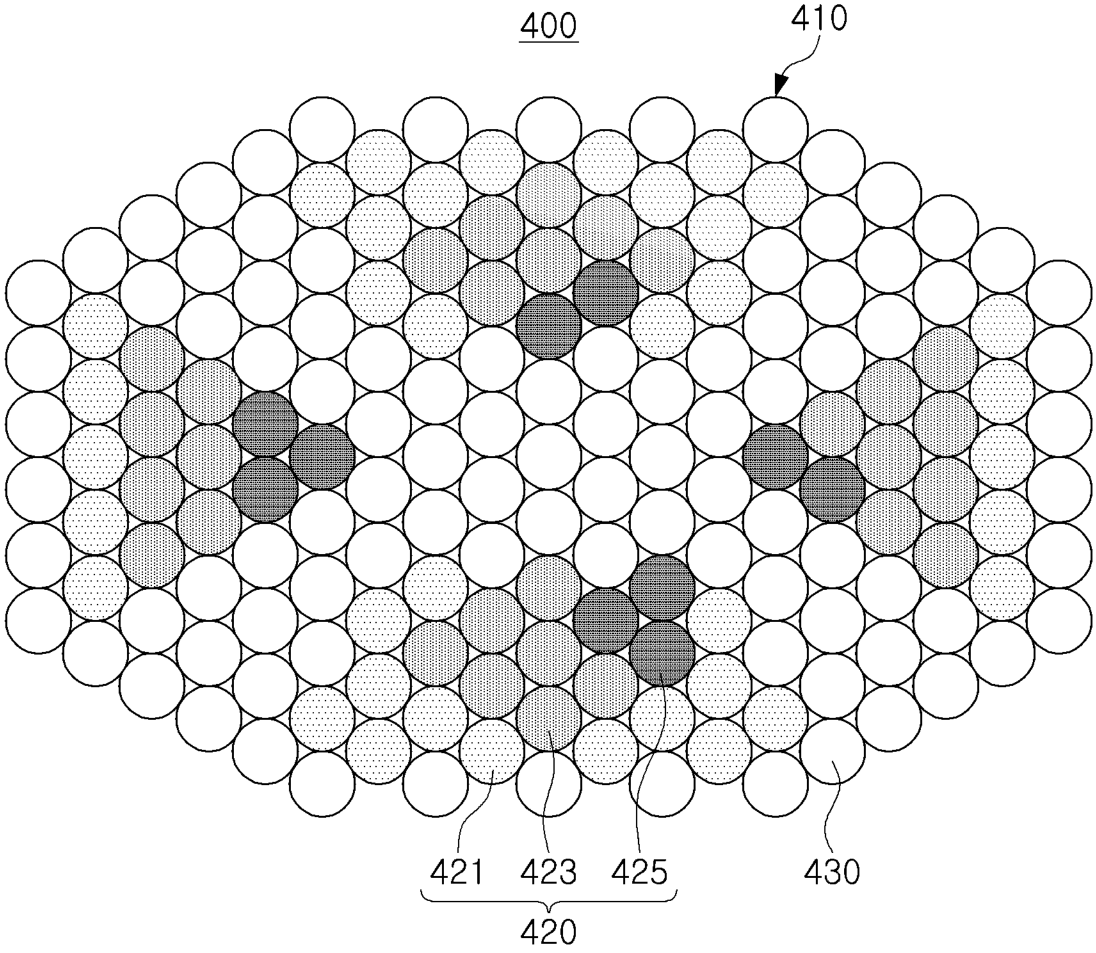

FIGS. 6 and 7 are diagrams illustrating operations of a semiconductor process apparatus according to an example embodiment.

FIGS. 6 and 7 illustrate a lighting mirror 400 included in an optical lighting system in a semiconductor process apparatus according to an example embodiment. Referring to FIGS. 6 and 7, the lighting mirror 400 may include a plurality of unit mirrors 410, and selected unit mirrors 420 of a portion of the plurality of unit mirrors 410 may be included in a reflective area, and the other non-selected unit mirrors 430 may be included in a non-reflective area. The posture of each of the unit mirrors 410 may be adjusted individually.

In the example embodiment illustrated in FIGS. 6 and 7, each of the unit mirrors 410 may have a circular shape, but the shape of a unit mirror in other embodiments is not limited thereto. For example, each of the unit mirrors 410 may have a hexagonal (honeycomb) shape, a diamond shape, an elliptical shape, or a quadrangular shape.

FIG. 6 illustrates the state of the lighting mirror 400 at a time point relatively shortly after the semiconductor process apparatus starts a semiconductor process. Referring to FIG. 6, as the semiconductor process is performed, contamination or aberration errors may appear in a portion of the selected unit mirrors 420 included in the reflective area among the plurality of unit mirrors 410. Contamination may hardly appear in the non-selected unit mirrors 430 disposed in a non-reflective area to which extreme ultraviolet light is not directly irradiated.

Also, contamination of each of the selected unit mirrors 420 may appear differently depending on the intensity of the extreme ultraviolet light reflected by that mirror. Referring to FIG. 6, the first selected unit mirror 421 included in the reflective area may be relatively less contaminated than the second selected unit mirror 423. This may be because, for example, the intensity of extreme ultraviolet light reflected from the first selected unit mirror 421 may be weaker than the intensity of extreme ultraviolet light reflected from the second selected unit mirror 423.

FIG. 7 illustrates the state of the lighting mirror 400 at a time point when a predetermined time has elapsed after the semiconductor process apparatus started the semiconductor process. Referring to FIG. 7, as time elapses after the semiconductor process starts, a contamination or aberration error in the third selected unit mirrors 425, which is a portion of the selected unit mirrors 420 included in the reflective area, may worsen. In the non-selected unit mirrors 430 included in the non-reflective area to which extreme ultraviolet light is not directly irradiated and there may be little to no worsening of a contamination or aberration error.

For example, in the example embodiment illustrated in FIG. 7, the selected unit mirrors 420 may include a first selected unit mirror 421, a second selected unit mirror 423, and a third selected unit mirror 425. The first selected unit mirror 421 may be contaminated the least, and the third selected unit mirror 425 may be contaminated the most. In the third selected unit mirror 425, the extreme ultraviolet light may not be reflected normally due to contamination and aberration error. For example, in the third selected unit mirror 425, excessive extreme ultraviolet light loss may occur during reflection of the extreme ultraviolet light, and accordingly, the extreme ultraviolet light emitted from the optical lighting system and traveling to the mask stage is not formed into a desired pattern.

In an example embodiment, a control unit of the semiconductor process apparatus may track the number of times the lighting mirror 400 included in the optical lighting system is used and/or the duration of use of the lighting mirror 400 when the semiconductor process starts, and may quantitatively calculate the degree of degradation of each of the unit mirrors 410 included in the lighting mirror 400. The control unit may, based on the degree of degradation of each unit mirror 410, identify the third selected unit mirror 425, which has been degraded to the extent that the unit mirror may not normally reflect extreme ultraviolet light, as illustrated in the example embodiment illustrated in FIG. 7, and may replace the third selected unit mirror 425 with another unit mirror. For example, another unit mirror to replace the third selected unit mirror 425 may be selected from the non-selected unit mirrors 430.

As such, in an example embodiment, in the lighting mirror 400 locally reflecting the extreme ultraviolet light, at least one of the selected unit mirrors 420 included in the reflective area may be replaced with at least one of the non-selected unit mirrors 430 in the non-reflective area. Accordingly, the lifespan of the lighting mirror 400 and the optical lighting system including the same may be increased, and the yield and productivity of the semiconductor process may be improved by increasing the operation rate of the semiconductor process apparatus.

Figure 8:
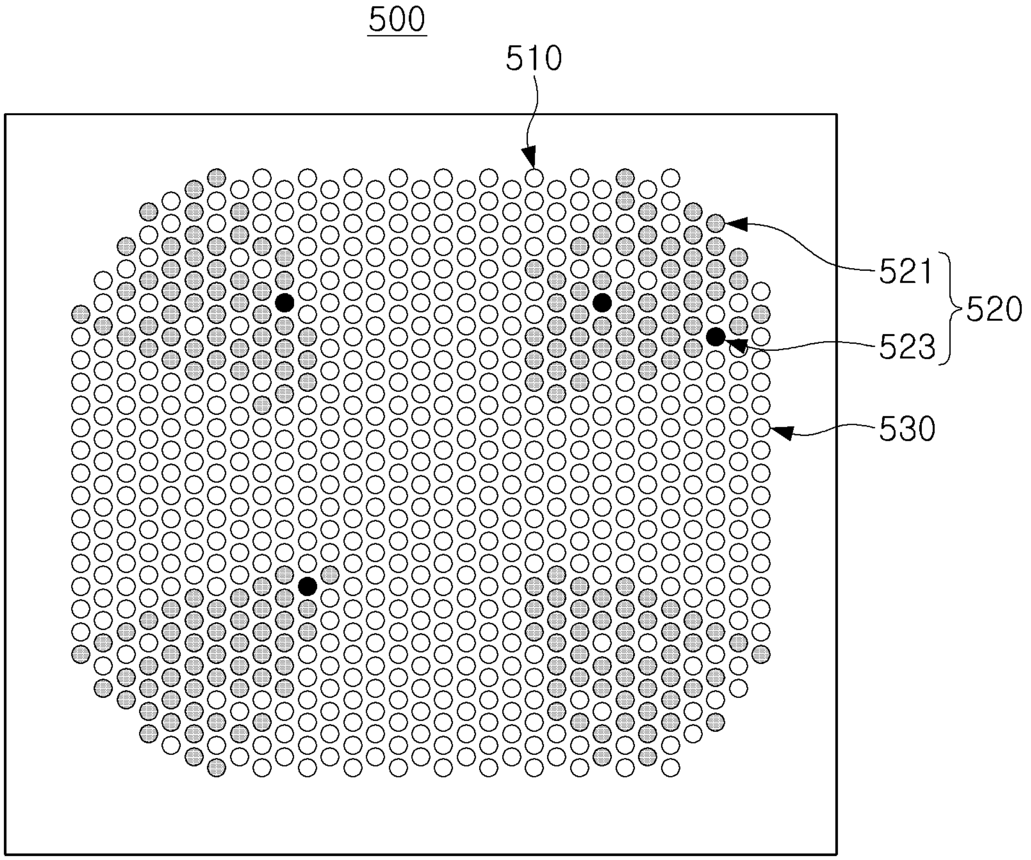
FIGS. 8, 9, and 10 are diagrams illustrating operations of a semiconductor process apparatus according to an example embodiment of the present disclosure.
Figure 9:
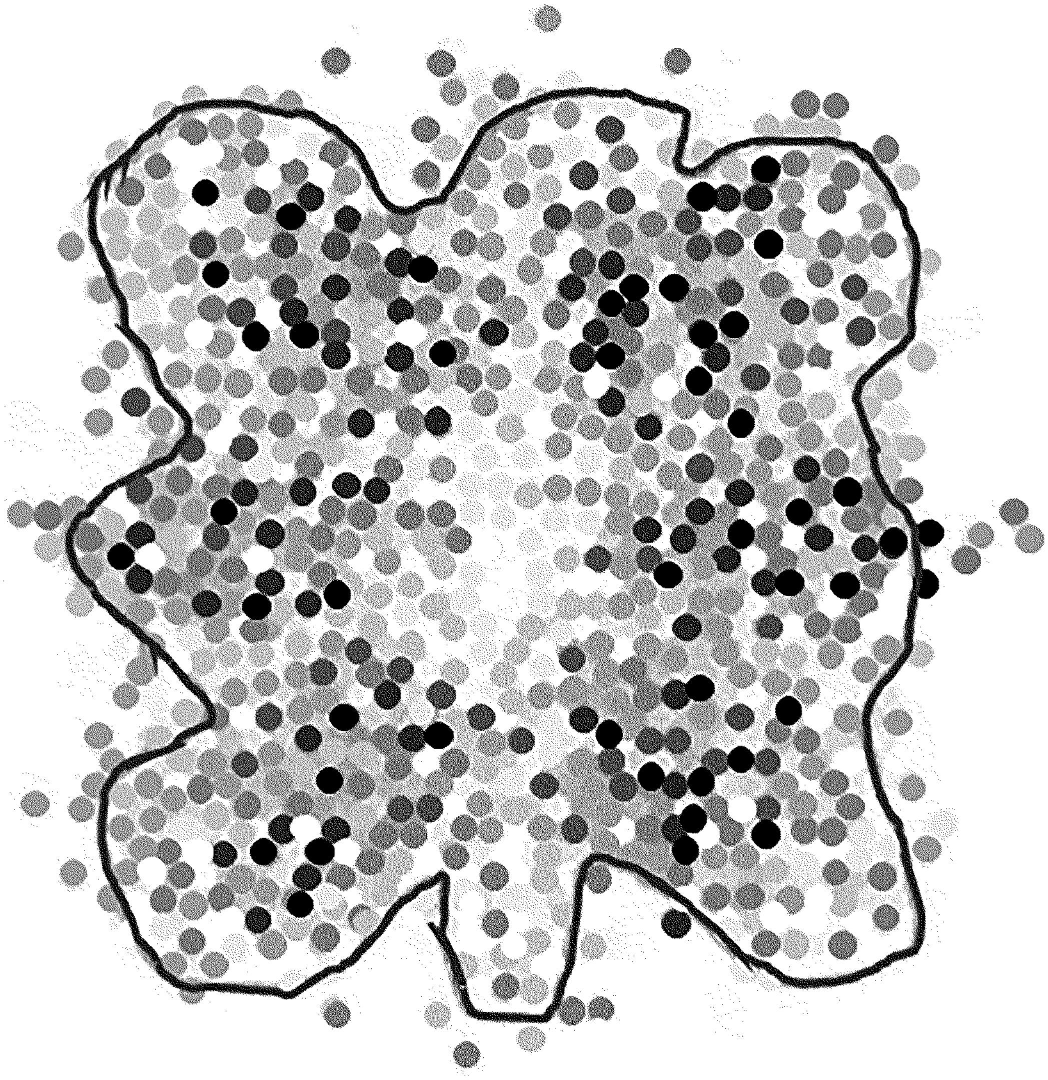
Figure 10:
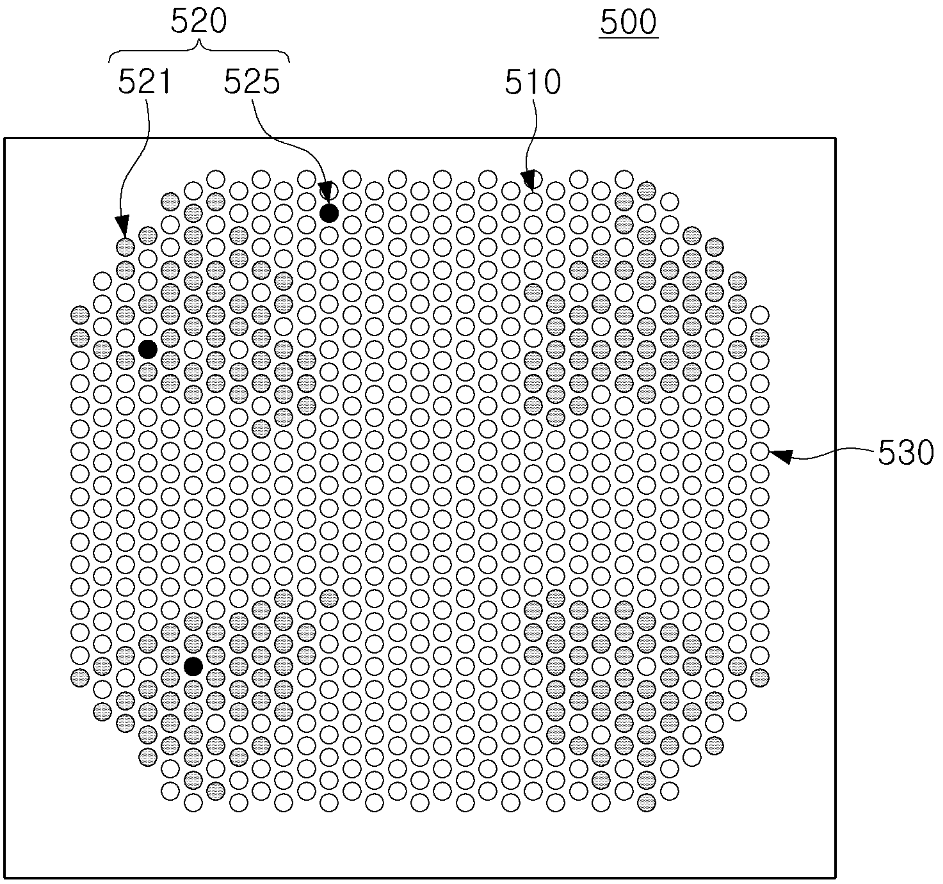

FIGS. 8 to 10 are diagrams illustrating operations of a semiconductor process apparatus according to an example embodiment.

FIG. 8 illustrates the state of the first lighting mirror 500 of the optical lighting system after the semiconductor process starts in the semiconductor process apparatus and a predetermined time has elapsed. The first lighting mirror 500 may include a plurality of unit mirrors 510 and may be disposed on the rear end of the optical lighting system based on a traveling path of extreme ultraviolet light. For example, the extreme ultraviolet light reflected from the first lighting mirror 500 may be emitted from the optical lighting system.

The first lighting mirror 500 may include a plurality of unit mirrors 510 of which a posture of each unit mirror in the plurality of unit mirrors 510 may be individually controlled. The plurality of unit mirrors 510 may include selected unit mirrors 520 disposed in a reflective area configured to reflect the extreme ultraviolet light, and non-selected unit mirrors 530 disposed in a non-reflective area not reflecting the extreme ultraviolet light. In the example embodiment illustrated in FIG. 8, the selected unit mirrors 520 disposed in the reflective area may include first selected unit mirrors 521 and second selected unit mirrors 523 depending on the degree of degradation of individual unit mirrors.

The second selected unit mirrors 523 may have a relatively high degree of degradation as compared to the first selected unit mirrors 521, and the control unit of the semiconductor process apparatus may identify the second selected unit mirrors 523 and may replace the unit mirror with a portion of the non-selected unit mirrors 530. The control unit may select a portion of the non-selected unit mirrors 530 to replace the second selected unit mirrors 523 and the second selected unit mirrors 523 by referring to a cumulative degradation indicator indicating the degree of degradation of the unit mirrors 510 depending on the cumulative time of the semiconductor process.

For example, in the degree of degradation determined by the control unit for each of the unit mirrors 510, influence due to degradation of the second lighting mirror included in the optical lighting system along with the first lighting mirror 500 may be reflected in addition to influence due to degradation of the first lighting mirror 500. Accordingly, the control unit may select a unit mirror from the non-selected unit mirrors 530 to replace the second selected unit mirrors 523 having a relatively high degree of degradation among the plurality of unit mirrors 510 by referring to a cumulative degradation indicator, which may vary depending on the number of times the unit mirrors 510 are used while the semiconductor process is performed, and/or the cumulative duration during which the semiconductor process is performed.

FIG. 9 illustrates the cumulative degradation indicator 540 applied to determine the degree of degradation of each of the plurality of unit mirrors 500. For example, the cumulative degradation indicator 540 may be data obtained experimentally. As illustrated in FIG. 8, the control unit may identify the second selected unit mirrors 523 having a relatively high degree of degradation from the first lighting mirror 520 and may select a unit mirror to replace the second selected unit mirrors 523 by referring to the cumulative degradation indicator 540.

In an example embodiment, the control unit may select a portion of the non-selected unit mirrors 530 in which a change of pattern of extreme ultraviolet light is minimized by referring to the cumulative time during which the semiconductor process is performed in the semiconductor process apparatus and the cumulative degradation indicator 540, and may replace the second selected unit mirrors 523 with the selected non-selected unit mirrors. Referring to FIGS. 8 and 10 together, the extreme ultraviolet light may be no longer irradiated to the second selected unit mirrors 523, and replacement unit mirrors 525 may be selected to replace the second selected unit mirrors 523 from among non-selected unit mirrors 530. Accordingly, the selected unit mirrors 520 and the reflective area including the same may change.

Even though the selected unit mirrors 520 and the reflective area are changed, the pattern of the extreme ultraviolet light emitted from the optical lighting system to the mask stage may be maintained as is, and accordingly, the control unit may also adjust other lighting mirrors in addition to changing the reflective area of the first lighting mirror 500. For example, the control unit may change the posture of at least one unit mirror included in the second lighting mirror configured to reflect extreme ultraviolet light to the first lighting mirror 500. Also, in an example embodiment, the control unit may change the posture of at least one of the first selected unit mirrors 521 not affected by the change in the reflective area among the selected unit mirrors 521 and 525 of the first lighting mirror 500 and may maintain the pattern of the extreme ultraviolet light.

Figure 11:
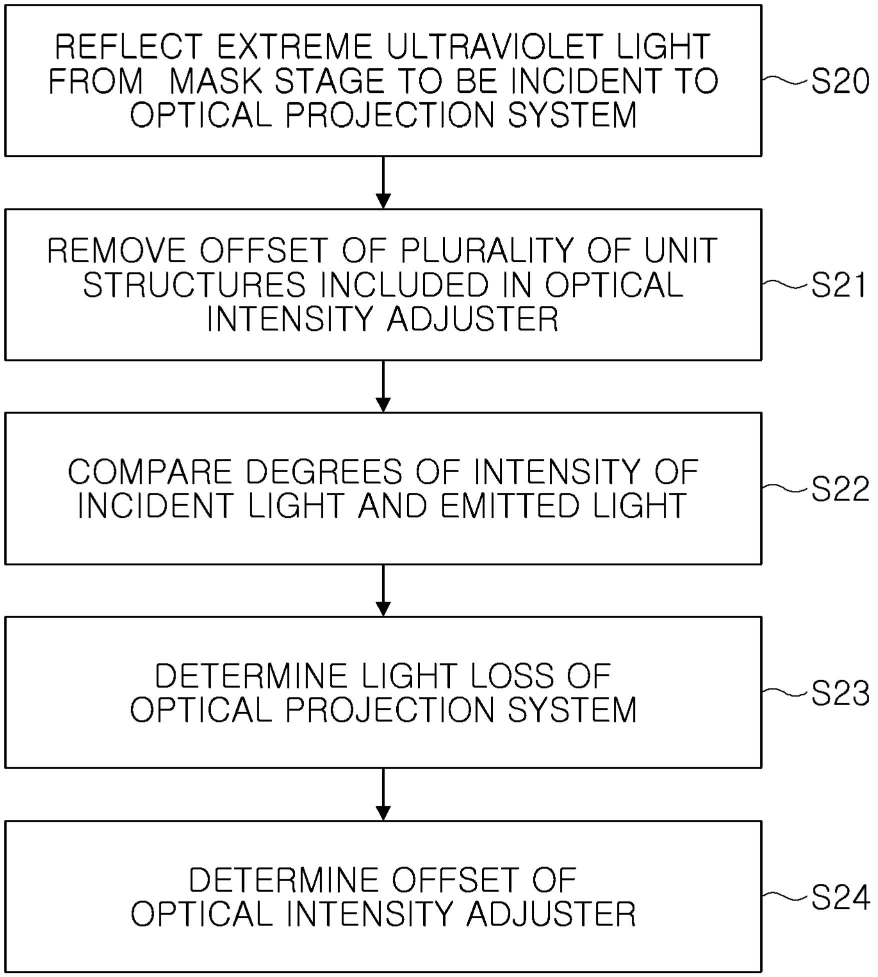
FIG. 11 is a flowchart illustrating operations of a semiconductor process apparatus according to an example embodiment of the present disclosure.

FIG. 11 is a flowchart illustrating the operation of a semiconductor process apparatus according to an example embodiment.

FIG. 11 is a flowchart illustrating a method of accurately measuring and compensating for extreme ultraviolet light loss in an optical projection system during the operation of a semiconductor process apparatus according to an example embodiment. Referring to FIG. 11, the operation of the semiconductor process apparatus according to an example embodiment may start with an operation in which extreme ultraviolet light reflected from a mask stage is incident to the optical projection system (S20). The extreme ultraviolet light may be reflected from a mask disposed on the mask stage. The mask may be configured as a reflective mask and may include a reflective area, a non-reflective area, and an intermediate reflective area.

The optical projection system may reflect the extreme ultraviolet light multiple times and may output the reflected extreme ultraviolet light to a substrate stage, and extreme ultraviolet light may be irradiated to a substrate such as a wafer disposed on the substrate stage. In an example embodiment, the extreme ultraviolet light passing through the optical projection system may be irradiated to the substrate in the same manner as a scanner. For example, extreme ultraviolet light irradiating to a substrate may have a pattern extending in a predetermined first direction, and scanning may be performed a second direction intersecting the first direction.

An optical intensity adjuster may be disposed between the optical projection system and the mask stage, and the optical intensity adjuster may include a plurality of unit structures. The control unit of the semiconductor process apparatus may reduce the difference in intensity of extreme ultraviolet light in the first direction by adjusting an offset which determines the position of each of the unit structures. In a position adjacent to the optical intensity adjuster, the first optical detector for measuring the intensity of incident extreme ultraviolet light entering the optical projection system may be disposed, and a second optical detector for measuring the intensity of emitted extreme ultraviolet light emitted from the optical projection system may be disposed between the optical projection system and the substrate stage.

The control unit may initialize the position of the unit structures by removing the offset of each of the unit structures included in the optical intensity adjuster (S21). The control unit may measure and compare the degrees of intensity of the incident extreme ultraviolet light and the emitted extreme ultraviolet light of the optical projection system (S22). In a state in which an offset is reflected in each of the unit structures to maintain the intensity of the extreme ultraviolet light uniformly in the first direction, the intensity of both the incident extreme ultraviolet light and the emitted extreme ultraviolet light of the optical projection system may be affected by the optical intensity adjuster. Accordingly, it may be difficult to accurately measure the extreme ultraviolet light loss occurring in the optical projection system.

In an example embodiment, while the optical intensity adjuster is initialized, the extreme ultraviolet light loss of the optical projection system may be more accurately determined by measuring and comparing the degrees of intensity of the incident extreme ultraviolet light and the emitted extreme ultraviolet light of the optical projection system with each other, and the extreme ultraviolet light loss of the optical projection system may be determined more accurately (S23). The control unit may determine an offset of each of the unit structures included in the optical intensity adjuster based on the result of the determination in operation S23 (S24).

In an example embodiment, in operation S24, at least one of a common offset commonly applied to each of the unit structures and individual offsets individually applied to each of the unit structures may be adjusted. For example, when it is determined that the extreme ultraviolet light loss occurring in the optical projection system is excessively large, the control unit may adjust the common offset to increase the intensity of the emitted extreme ultraviolet light. When the distribution of intensity of the extreme ultraviolet light in the first direction is determined to be uneven due to the extreme ultraviolet light loss occurring in the optical projection system, the control unit may change the distribution of the intensity of the emitted extreme ultraviolet light to be more uniform by adjusting the individual offset.

Figure 12:
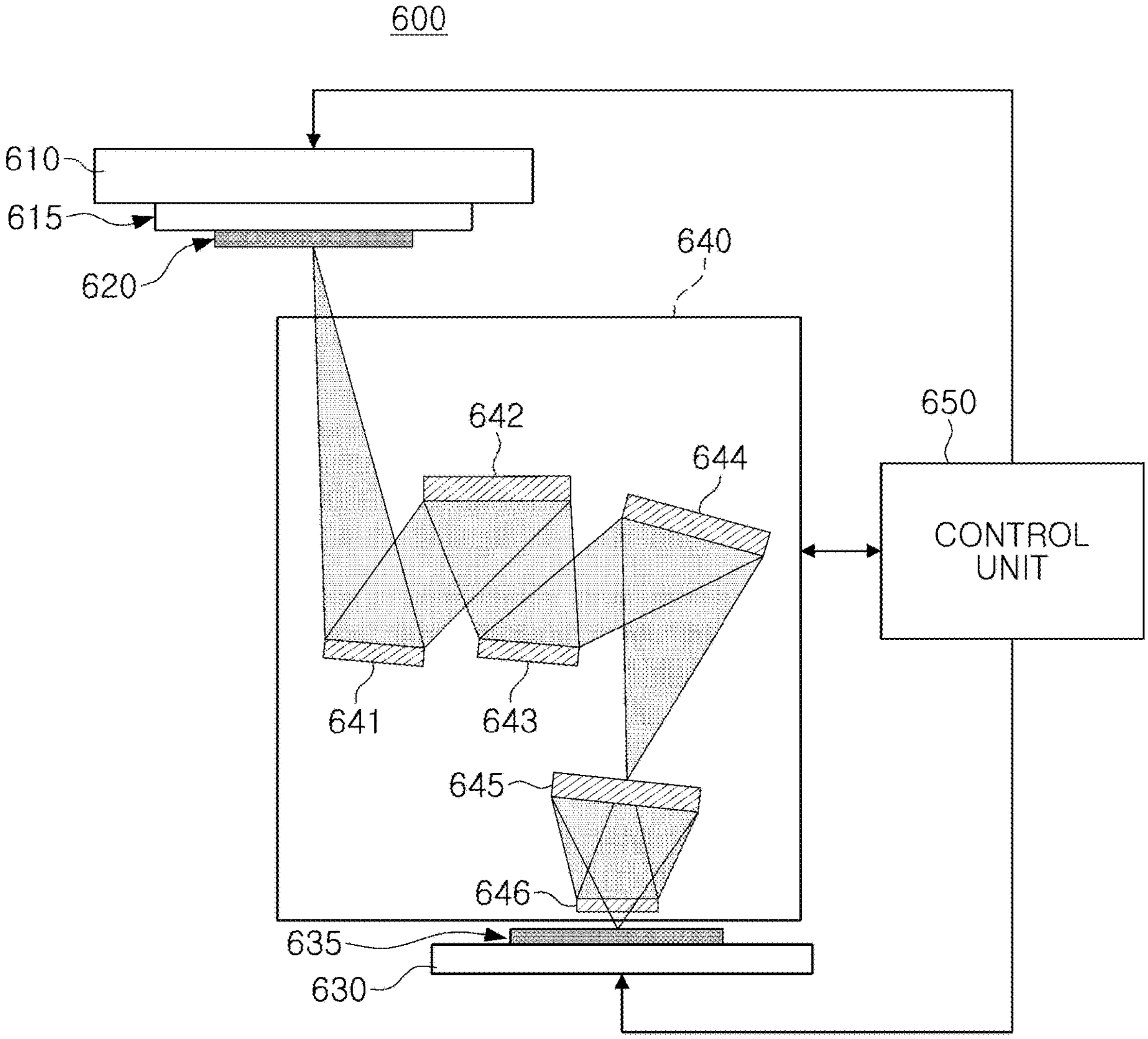
FIG. 12 is a diagram illustrating operations of a semiconductor process apparatus according to an example embodiment of the present disclosure.

FIG. 12 is a diagram illustrating operation of a semiconductor process apparatus according to an example embodiment.

Referring to FIG. 12, a semiconductor process apparatus 600 according to an example embodiment may include a mask stage 610, an optical intensity adjuster 620, a substrate stage 630, an optical projection system 640, and a control unit 650. A mask 615 may be disposed on the mask stage 610, and a substrate 235, such as a wafer, may be disposed on the substrate stage 630.

The optical projection system 640 may include a plurality of projection mirrors 641-646 for reflecting the extreme ultraviolet light reflected from the mask 615, and the extreme ultraviolet light reflected from the plurality of projection mirrors 641-646 may be incident to the substrate 635. The control unit 650 may operate the semiconductor process apparatus 600 such that, by adjusting, together with the mask stage 610 and the substrate stage 630, positions and postures of the plurality of projection mirrors 641-646, the extreme ultraviolet light reflected from the mask 615 may be incident to substrate 635.

Also, the control unit 650 may control the optical intensity adjuster 620. The optical intensity adjuster 620 may include a plurality of unit structures arranged in a predetermined first direction, and the intensity of the extreme ultraviolet light in the first direction may vary depending on the positions of the unit structures. The control unit 650 may adjust the position of each unit structure such that the extreme ultraviolet light may have uniform intensity in the first direction.

Each of the plurality of projection mirrors 641-646 may include a mirror body and a reflective layer disposed on the surface of the mirror body. The reflective layer may be formed on the surface of the mirror body to increase the reflectance of extreme ultraviolet light in each of the projection mirrors 641-646.

As illustrated in FIG. 12, at least a portion of the plurality of projection mirrors 641-646 may have different sizes. Also, in at least one of the projection mirrors 641-646, the extreme ultraviolet light may be irradiated to only a portion of an area of the mirror to be reflected, rather than the entire front surface of the mirror. extreme ultraviolet light loss may occur in the process of reflecting the extreme ultraviolet light in the plurality of projection mirrors 641-646. The extreme ultraviolet light loss may increase as the cumulative duration of the semiconductor process elapses after the semiconductor process starts.

In an example embodiment, to accurately measure the extreme ultraviolet light loss caused by the plurality of projection mirrors 641-646, in a state in which a position of the unit structures included in the optical intensity adjuster 620 is initialized, the intensity of each of the incident extreme ultraviolet light and the emitted extreme ultraviolet light of the optical projection system 640 may be measured. The control unit 650 may calculate the extreme ultraviolet light loss of the optical projection system 640 using the intensity of the incident extreme ultraviolet light and the intensity of the emitted extreme ultraviolet light measured as above and may determine whether it is necessary to perform a maintenance operation for the optical projection system 640, including replacement of one or more of the projection mirrors 641-646.

In an example embodiment, the intensity of the incident extreme ultraviolet light and the intensity of the emitted extreme ultraviolet light of the optical projection system 640 may be measured while reducing the influence of the optical intensity adjuster 620 by initializing the positions of the unit structures, such that the extreme ultraviolet light loss of the optical projection system 640 may be determined more accurately. Accordingly, the efficiency of the maintenance operations of the optical projection system 640 may improve, and the yield and productivity of the semiconductor process may improve.

Also, in an example embodiment, the control unit 650 may change an offset of each of the unit structures included in the optical intensity adjuster 620 based on the extreme ultraviolet light loss of the optical projection system 640. For example, the control unit 650 may increase or decrease the intensity of the extreme ultraviolet light by changing an offset commonly applied to the unit structures. Also, in an example embodiment, the control unit 650 may uniformly adjust the distribution of the intensity of the extreme ultraviolet light by changing the offset applied to the unit structures individually.

Figure 13:
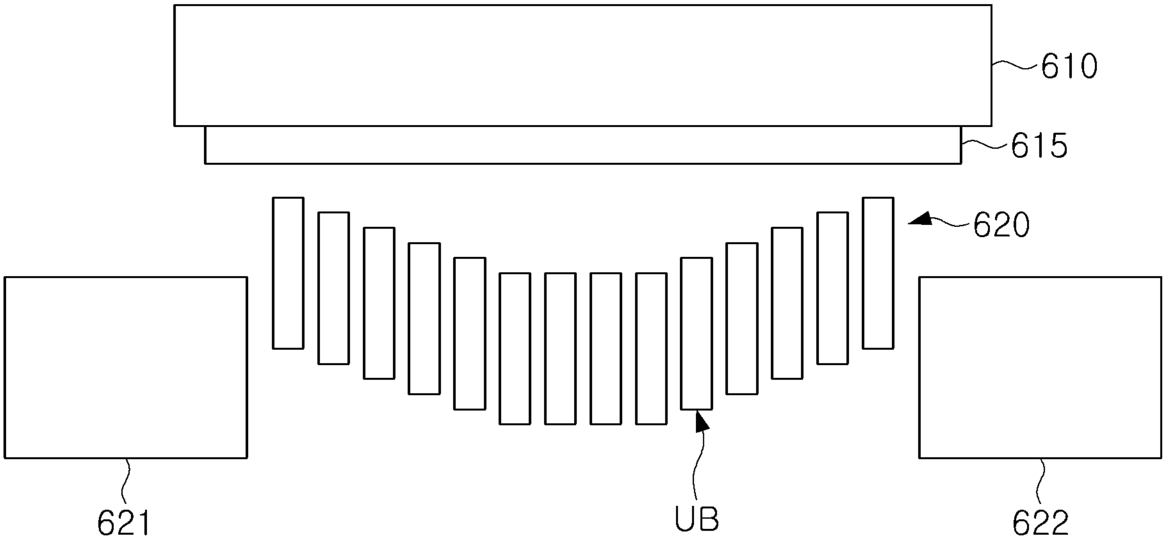
FIGS. 13 and 14 are diagrams illustrating operations of a semiconductor process apparatus according to an example embodiment of the present disclosure.
Figure 14:
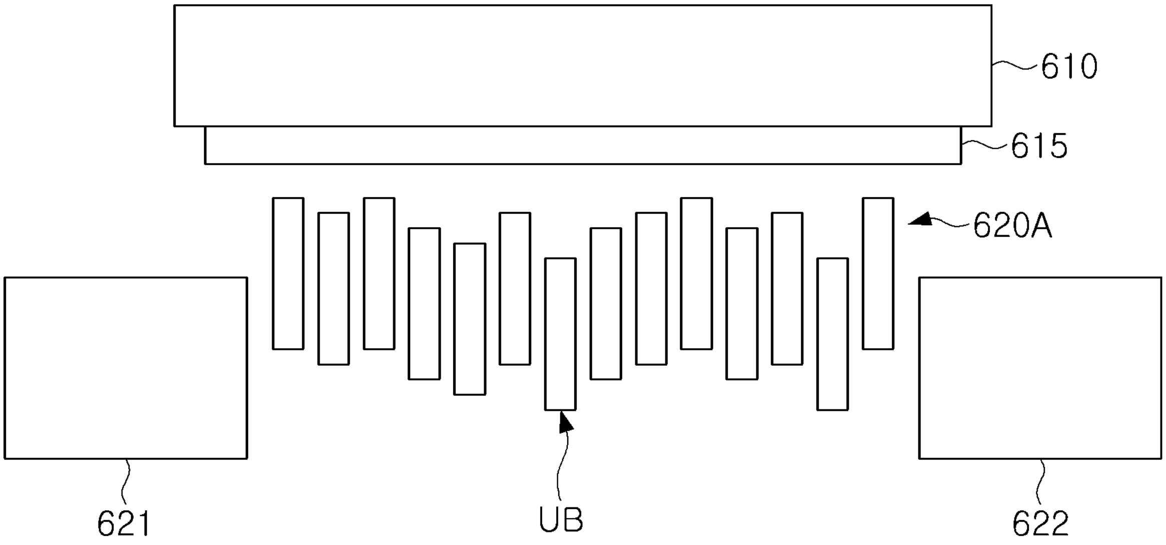

FIGS. 13 and 14 are diagrams illustrating operations of a semiconductor process apparatus according to an example embodiment.

FIGS. 13 and 14 illustrate a mask stage 610 and an optical intensity adjuster 620 included in the semiconductor process apparatus. Referring to FIGS. 13 and 14, a mask 615 may be disposed on the mask stage 610, and optical detectors 621 and 622 for measuring the intensity of the extreme ultraviolet light may be disposed on both sides of the optical intensity adjuster 620. The optical intensity adjuster 620 may include a plurality of unit structures UB arranged in a predetermined first direction, and the distribution of the intensity of the extreme ultraviolet light in the first direction may be varied depending on the positions of the unit structures UB.

Referring to FIG. 13, among the unit structures UB of the optical intensity adjuster 620, more individual offsets may be reflected in the unit structures UB disposed in a position close to the center of the mask 615. In the example embodiment illustrated in FIG. 14, individual offsets of the unit structures UB may be assigned without a specific tendency. This may be because the distribution of the intensity of the extreme ultraviolet light reflected from mask 615 may vary depending on the pattern of the extreme ultraviolet light, the optical lighting system, and/or the characteristics of a light source.

The optical detectors 621 and 622 may measure the intensity of the incident extreme ultraviolet light entering the optical projection system after being reflected from the mask 615. Since the optical detectors 621 and 622 measure the intensity of the incident extreme ultraviolet light of which intensity has been adjusted by the optical intensity adjuster 620, the influence of the optical intensity adjuster 620 may be reflected in the intensity of the incident extreme ultraviolet light detected by the optical detectors 621 and 622. Accordingly, when the intensity of the incident extreme ultraviolet light is detected while the optical intensity adjuster 620 is configured as illustrated in FIG. 13 or 14, the extreme ultraviolet light loss in the optical projection system may not be accurately measured.

In an example embodiment, the optical detectors 621 and 622 may measure the intensity of the incident extreme ultraviolet light while a position of each of the unit structures UB included in the optical intensity adjuster 620 is initialized. For example, the position of each of the unit structures UB may be adjusted to a position close to the mask 615. Accordingly, the extreme ultraviolet light loss occurring when the extreme ultraviolet light is reflected several times or more in the optical projection system may be accurately measured.

In an example embodiment, the position in which the intensity of the incident extreme ultraviolet light of the optical projection system is measured may be different from the position in which the intensity of the emitted extreme ultraviolet light of the optical projection system is measured. For example, the position in which the intensity of the incident extreme ultraviolet light of the optical projection system is measured may be closer to both ends of an area to which the extreme ultraviolet light is irradiated as compared to the position in which the intensity of the emitted extreme ultraviolet light of the optical projection system is measured.

As illustrated in FIGS. 13 and 14, the optical detectors 621 and 622 may measure the intensity of incident extreme ultraviolet light at both ends of the optical intensity adjuster 620. In an example embodiment, an optical detector disposed between an optical projection system and a substrate stage may measure the intensity of the emitted extreme ultraviolet light in an area close to the center of the emitted extreme ultraviolet light emitted by the optical projection system. When the intensity of the incident extreme ultraviolet light measured by the optical detectors 621 and 622 at both ends of the optical intensity adjuster 620 is defined as A, and the intensity of the emitted extreme ultraviolet light of the optical projection system is defined as B, the extreme ultraviolet light loss of the optical projection system may be represented as in equation 1 below. In equation 1, "A0" and "B0" may respectively be the intensity of the incident extreme ultraviolet light and the intensity of emitted extreme ultraviolet light measured at a predetermined first time point, and "A1" and "B1" may respectively be the intensity of the incident extreme ultraviolet light and the intensity of the emitted extreme ultraviolet light measured at a second time point later than the first time point.

$$\text{light loss} = \frac{B0}{A0} - \frac{B1}{A1} \qquad \text{[Equation 1]}$$

Figure 15:
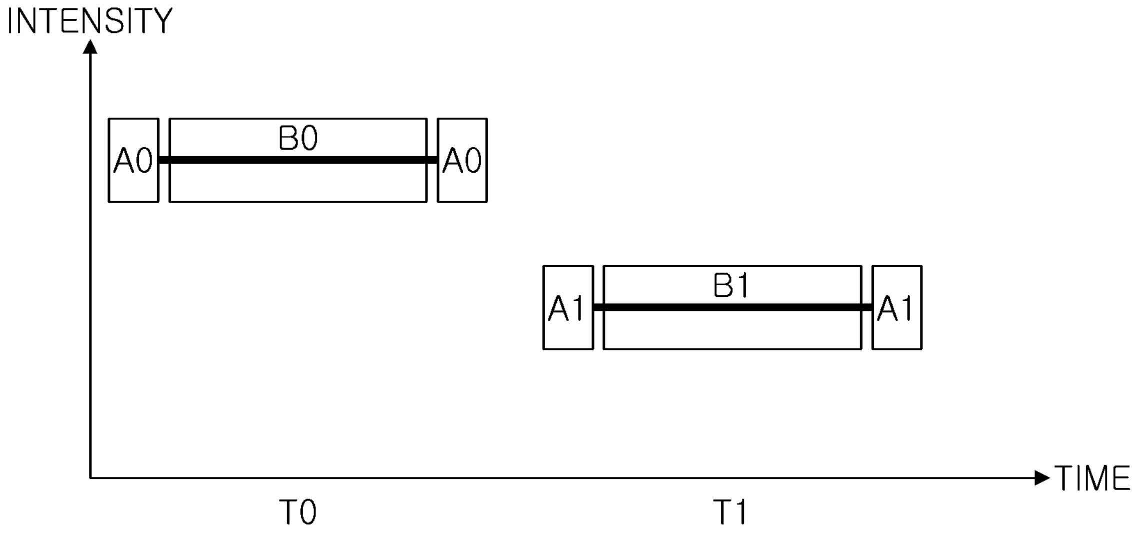
FIGS. 15 and 16 are diagrams illustrating operations of a semiconductor process apparatus according to an example embodiment of the present disclosure.
Figure 16:
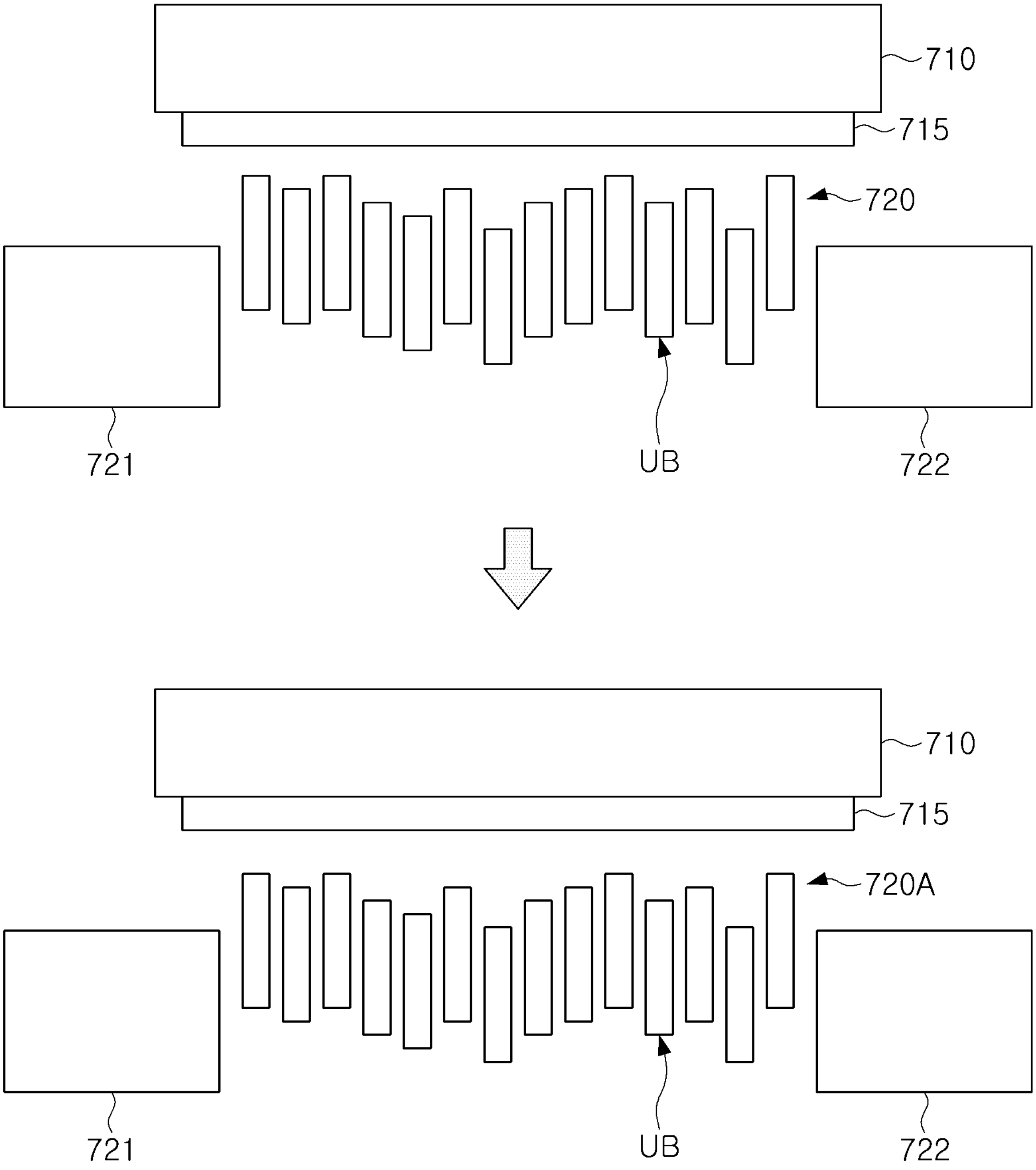

FIGS. 15 and 16 are diagrams illustrating operations of a semiconductor process apparatus according to an example embodiment.

FIG. 15 is a graph of extreme ultraviolet light loss in an optical projection system over time. In the example embodiment illustrated in FIG. 15, at a first time point TO, the incident extreme ultraviolet light of the optical system may have a first incident projection extreme ultraviolet light intensity A0, and the emitted extreme ultraviolet light may have a first emitted extreme ultraviolet light intensity B0. Meanwhile, at the second time point T1, after a predetermined time has elapsed from the first time point TO, the incident extreme ultraviolet light of the optical projection system may have a second incident extreme ultraviolet light intensity A1, and the emitted extreme ultraviolet light may have a second emitted extreme ultraviolet light intensity B1.

In the example embodiment illustrated in FIG. 15, as time passes, the extreme ultraviolet light loss in the optical projection system may increase and the intensity of the emitted extreme ultraviolet light may decrease, but the distribution of the intensity of emitted extreme ultraviolet light may be maintained uniformly. Accordingly, the control unit of the semiconductor process apparatus may adjust an offset of the optical intensity adjuster such that the overall intensity of emitted extreme ultraviolet light may be increased while the distribution of intensity of emitted extreme ultraviolet light is maintained as is.

Referring to FIG. 16, the semiconductor process apparatus may include a mask stage 710 on which the mask 715 is disposed, an optical intensity adjuster 720, and an optical detector 721 and 722, and the optical intensity adjuster 720 may include a plurality of unit structures UB. In the example embodiment described with reference to FIGS. 15 and 16, extreme ultraviolet light loss of the optical projection system may increase over time and the intensity of the emitted extreme ultraviolet light may decrease, and the distribution of the extreme ultraviolet light output by the optical projection system may be maintained uniformly.

Accordingly, as illustrated in FIG. 16, the control unit may collectively adjust the positions of the unit structures UB by changing a common offset commonly applied to the unit structures UB included in the optical intensity adjuster 720. Since the offset of each of the unit structures UB is changed by the same common offset, extreme ultraviolet light loss may be compensated for by increasing the intensity of extreme ultraviolet light while maintaining the distribution of extreme ultraviolet light output by the optical projection system.

Figure 17:
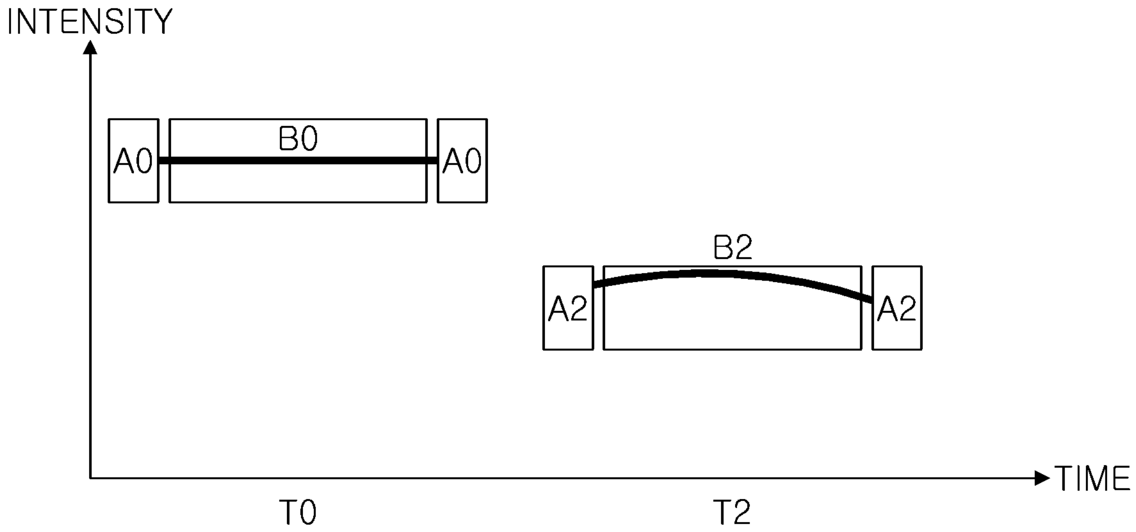
FIGS. 17 and 18 are diagrams illustrating operations of a semiconductor process apparatus according to an example embodiment of the present disclosure.
Figure 18:
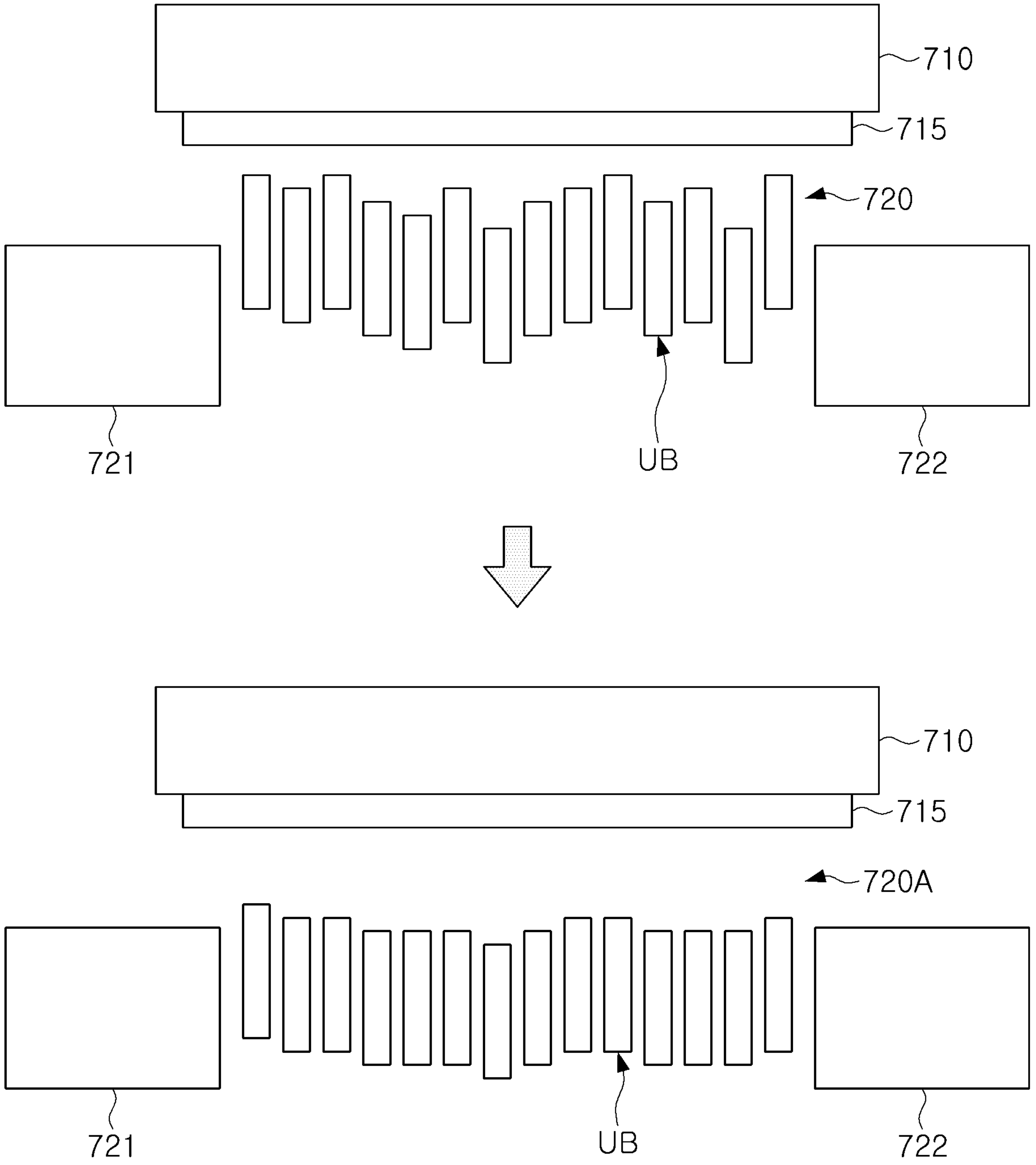

FIGS. 17 and 18 are diagrams illustrating operations of a semiconductor process apparatus according to an example embodiment.

FIG. 17 may be a graph of extreme ultraviolet light loss in an optical projection system over time. In the example embodiment illustrated in FIG. 17, at a first time point TO, incident extreme ultraviolet light of the optical system may have a first incident projection extreme ultraviolet light intensity A0, and emitted extreme ultraviolet light may have a first emitted extreme ultraviolet light intensity B0. At a third time point T2, after a predetermined time has elapsed from the first time point TO, incident extreme ultraviolet light of the optical projection system may have a third incident extreme ultraviolet light intensity A2, and emitted extreme ultraviolet light may have a third emitted extreme ultraviolet light intensity B2.

In the example embodiment illustrated in FIG. 17, as time passes, extreme ultraviolet light loss in the optical projection system may increase and the intensity of emitted extreme ultraviolet light may decrease, and also, the distribution of the intensity of the emitted extreme ultraviolet light may also change unevenly. Accordingly, the control unit of the semiconductor process apparatus may adjust an offset of unit structures of the optical intensity adjuster such that both the distribution of the intensity of the emitted extreme ultraviolet light and the overall intensity of the emitted extreme ultraviolet light may be changed.

Referring to FIG. 18, the semiconductor process apparatus may include a mask stage 710 on which a mask 715 is disposed, an optical intensity adjuster 720, and optical detectors 721 and 722. The optical intensity adjuster 720 may include a plurality of unit structures UB. In the example embodiment described with reference to FIGS. 17 and 18, the extreme ultraviolet light loss of the optical projection system may increase over time and the intensity of the emitted extreme ultraviolet light may decrease, and also, uniformity of the distribution of the extreme ultraviolet light output by the optical projection system may degrade.

Accordingly, as illustrated in FIG. 18, the control unit may adjust the positions of the unit structures UB by changing an individual offset applied to each of the unit structures UB included in the optical intensity adjuster 720. By adjusting an offset of each of the unit structures UB, the distribution of intensity of extreme ultraviolet light emitted from the optical projection system and traveling to the substrate stage may be uniformly changed, and also, the overall intensity of extreme ultraviolet light may be increased such that extreme ultraviolet light loss of the optical projection system may be compensated for.

Figure 19:
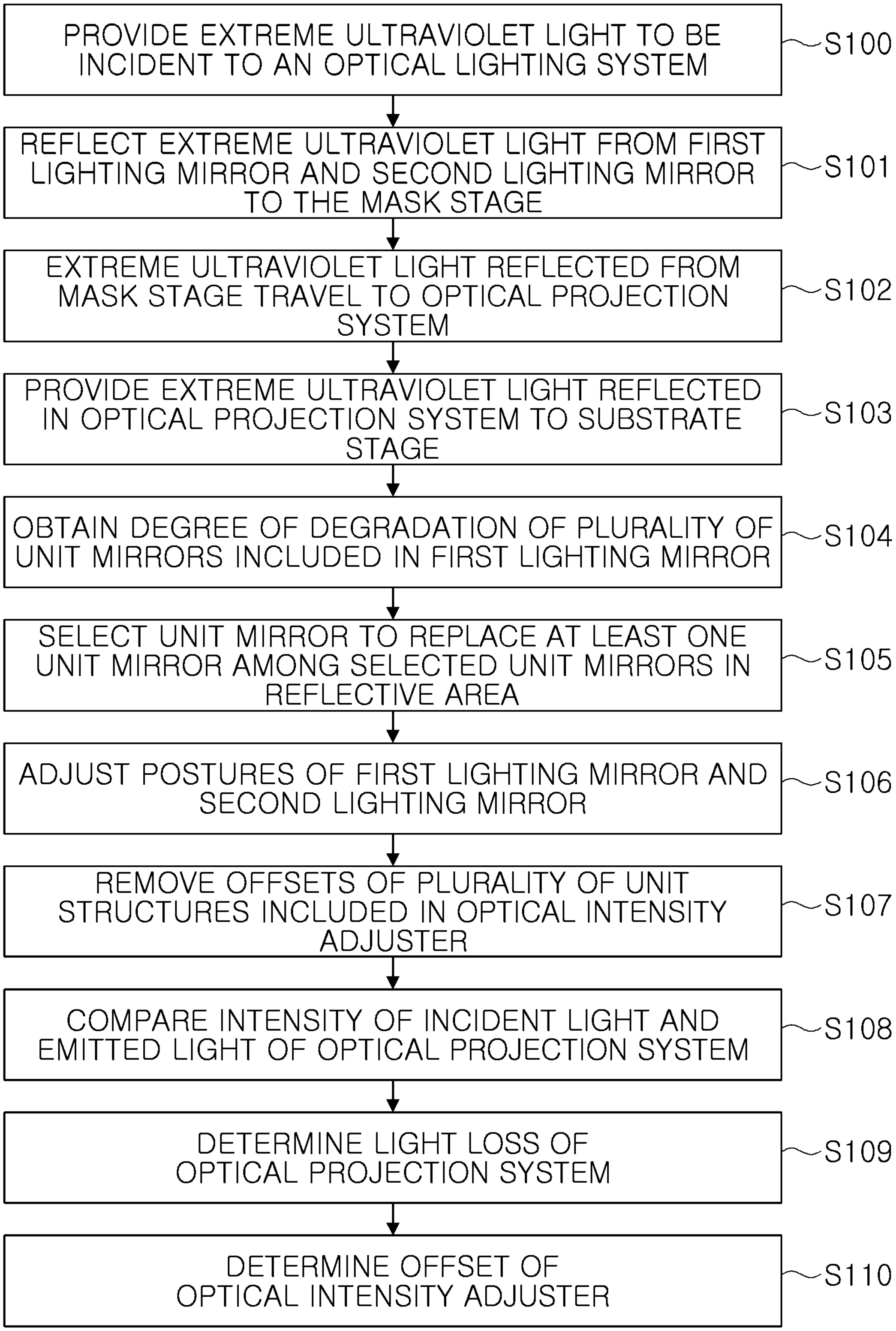
FIG. 19 is a flowchart illustrating operation of a semiconductor process apparatus according to an example embodiment of the present disclosure.

FIG. 19 is a flowchart illustrating operation of a semiconductor process apparatus according to an example embodiment.

Referring to FIG. 19, the operation of the semiconductor process apparatus according to an example embodiment may start with extreme ultraviolet light output by a light source being incident to the optical lighting system (S100). In the example embodiment, the light source may output the extreme ultraviolet light having a high energy density in the range of several nanometers to tens of nanometers. The extreme ultraviolet light may be reflected from a first lighting mirror and a second lighting mirror included in the optical lighting system and may travel to the mask stage (S101).

The optical lighting system may further include other lighting mirrors in addition to the first lighting mirror and the second lighting mirror, and the first lighting mirror may be disposed last relative to the other mirrors on a traveling path of the extreme ultraviolet light in the optical lighting system. Each of the first lighting mirror and the second lighting mirror may include a plurality of unit mirrors of which each unit mirror may have an individually controlled posture.

The extreme ultraviolet light traveling to the mask stage may be incident to the optical projection system after being reflected from the mask disposed on the mask stage (S102). The optical projection system may include a plurality of projection mirrors, and the extreme ultraviolet light reflected by the plurality of projection mirrors in the optical projection system may travel to the substrate stage (S103). The extreme ultraviolet light may be incident to a substrate such as a wafer disposed on the substrate stage, and a semiconductor process, for example, an exposure process, may be performed using the extreme ultraviolet light.

While the semiconductor process including operations S100 to S103 is performed, the control unit of the semiconductor process apparatus may monitor each of the optical lighting system and the optical projection system. For example, referring to FIG. 19, the control unit may obtain the degree of degradation of the plurality of unit mirrors included in the first lighting mirror of the optical lighting system (S104). The first lighting mirror may reflect the extreme ultraviolet light only from a selected portion of unit mirrors included in a reflective area, and accordingly, as the number of semiconductor processes and the duration in which the semiconductor process is performed is accumulated, the degrees of degradation in the plurality of unit mirrors may appear differently for the unit mirrors of the plurality.

Based on the degree of degradation obtained in operation S104, the control unit may select a unit mirror to replace at least one unit mirror in the non-reflective area among the selected unit mirrors in the reflective area (S105). By replacing at least one selected unit mirror having a relatively high degree of degradation among the selected unit mirrors disposed in the reflective area with a non-selected unit mirror included in the non-reflective area, the lifespan of the optical lighting system including the first lighting mirror may be increased. Also, by increasing the lifespan of the optical lighting system, the yield and productivity of the semiconductor process may also be improved.

The control unit may adjust the postures of the first lighting mirror and the second lighting mirror (S106), and the individual unit mirrors contained therein. At least one of the selected unit mirrors included in the reflective area of the first lighting mirror may be replaced with a non-selected unit mirror in the non-reflective area, and by adjusting the postures of the first lighting mirror and the second lighting mirror and the individual unit mirrors contained therein, changes in intensity and/or pattern of extreme ultraviolet light irradiated to the mask may be reduced.

The control unit may remove offsets of the plurality of unit structures included in the optical intensity adjuster to accurately monitor the extreme ultraviolet light loss of the optical projection system (S107). For example, in operation S107, the offsets of the unit structures may be removed by initializing a position of each of the unit structures, and the influence of the unit structures on the intensity of extreme ultraviolet light reflected from the mask may be reduced.

When the offsets of the plurality of unit structures included in the optical intensity adjuster are removed, the control unit may measure the intensity of the incident extreme ultraviolet light and the emitted extreme ultraviolet light of the optical projection system using optical detectors and may compare the degrees of intensity (S108). For example, the intensity of the incident extreme ultraviolet light in the optical projection system may be measured at both ends of the optical projection system and the intensity of the emitted extreme ultraviolet light in the optical projection system may be measured in an area close to a center of the emitted extreme ultraviolet light incident to the substrate.

The control unit may determine the extreme ultraviolet light loss of the optical projection system using the intensity of the incident extreme ultraviolet light and the emitted extreme ultraviolet light measured in operation S108 (S109). As described above, the extreme ultraviolet light loss of the optical projection system may be determined using an intensity ratio between the incident extreme ultraviolet light and the emitted extreme ultraviolet light, and based on the determination, the offset of the optical intensity adjuster may be determined (S110).

For example, as a result of the determination of operation S109, when it is determined that the intensity of the extreme ultraviolet light output to the substrate stage is reduced due to the extreme ultraviolet light loss of the optical projection system, the control unit may adjust a common offset commonly applied to unit structures included in the optical intensity adjuster. As a result of operation S109, when the distribution of the intensity of the extreme ultraviolet light output to the substrate stage is determined to be unevenly degraded due to the extreme ultraviolet light loss in the optical projection system, the control unit may adjust individual offsets individually applied to the unit structures included in the optical intensity adjuster. Accordingly, a decrease in the yield of the semiconductor process due to extreme ultraviolet light loss of the optical projection system may be reduced, and the lifespan of the optical projection system may be increased, such that maintenance costs of the semiconductor process apparatus may be reduced.

According to the aforementioned example embodiments, in at least one of the lighting mirrors included in the optical lighting system of the semiconductor process apparatus, the degree of degradation of each of unit mirrors may be detected and severely degraded unit mirrors may be replaced with other unit mirrors. Also, in a state in which the offset of the optical intensity adjuster disposed between the optical projection system and the mask stage is initialized, a difference in intensity between incident extreme ultraviolet light and emitted extreme ultraviolet light may be measured in the optical projection system, and by adjusting the optical intensity adjuster based on a result of the measurement, extreme ultraviolet light loss in the optical projection system may be managed stably.

While the example embodiments have been illustrated and described above, it will be configured as apparent to those skilled in the art that modifications and variations may be made without departing from the scope in the example embodiment as defined by the appended claims.

What is claimed is:

1. A semiconductor process apparatus, comprising:

an extreme ultraviolet light source configured to output extreme ultraviolet light within an extreme ultraviolet wavelength band;

a mask stage configured to support a mask configured to reflect extreme ultraviolet light in a pattern to result in patterned extreme ultraviolet light;

a substrate stage configured to support a substrate, wherein the substrate stage is configured to position a substrate supported by the substrate stage to be irradiated by the patterned extreme ultraviolet light reflected from the mask;

an optical lighting system including a plurality of lighting mirrors configured to guide the extreme ultraviolet light from the extreme ultraviolet light source to the mask stage;

an optical projection system including a plurality of projection mirrors configured to guide the patterned extreme ultraviolet light from the mask stage to the substrate stage;

a first optical detector disposed between the optical projection system and the mask stage and configured to sense the intensity of extreme ultraviolet light incident to the optical projection system;

a second optical detector disposed between the optical projection system and the substrate stage and configured to sense the intensity of extreme ultraviolet light incident to the substrate stage;

a control unit configured to control the extreme ultraviolet light source, the mask stage, the substrate stage, the optical lighting system, and the optical projection system; and an optical intensity adjuster disposed between the mask stage and the optical projection system and configured to adjust the intensity of the patterned extreme ultraviolet light, wherein, among the plurality of lighting mirrors, a first lighting mirror includes a plurality of unit mirrors, and the control unit is configured to determine a degree of degradation of each unit mirror of the plurality of unit mirrors based on past use of each unit mirror and to respectively replace at least one unit mirror of the plurality of unit mirrors with at least one other unit mirror, and wherein the control unit is configured to determine an extreme ultraviolet light loss of the optical projection system based on a first intensity of extreme ultraviolet light measured by the first optical detector and a second intensity of the extreme ultraviolet light measured by the second optical detector in a state in which an offset of the optical intensity adjuster is initialized.

2. The semiconductor process apparatus of claim 1, wherein the plurality of lighting mirrors further includes a second lighting mirror configured to reflect the extreme ultraviolet light that is incident to the optical lighting system, and the first lighting mirror is configured to reflect the extreme ultraviolet light reflected from the second lighting mirror, and wherein the control unit is configured to determine a degree of degradation of each unit mirror of the plurality of unit mirrors using a number of times of use of each unit mirror of the plurality of unit mirrors and a degree of degradation of the second lighting mirror.

3. The semiconductor process apparatus of claim 2, wherein the control unit is configured to change a posture of the first lighting mirror, a posture of the second lighting mirror, and replace the at least one unit mirror with other unit mirrors.

4. The semiconductor process apparatus of claim 2, wherein the plurality of unit mirrors included in the first lighting mirror is a plurality of first unit mirrors, and the second lighting mirror includes a plurality of second unit mirrors.

5. The semiconductor process apparatus of claim 4, wherein a total number of first unit mirrors in the plurality of first unit mirrors is greater than a total number of second unit mirrors in the plurality of second unit mirrors.

6. The semiconductor process apparatus of claim 4, wherein a ratio of a number of second unit mirrors configured to reflect extreme ultraviolet light, among the plurality of second unit mirrors, to a total number of the plurality of second unit mirrors is higher than a ratio of a number of first unit mirrors configured to reflect extreme ultraviolet light, among the plurality of first unit mirrors, to a total number of the plurality of first unit mirrors.

7. The semiconductor process apparatus of claim 1,
wherein the optical intensity adjuster includes a plurality of unit structures arranged in a predetermined first direction, and
wherein the control unit is configured to adjust positions of the plurality of unit structures in a second direction intersecting the first direction and to adjust a distribution of the intensity of extreme ultraviolet light that is incident in the first direction.

8. The semiconductor process apparatus of claim 7, wherein the control unit is configured to determine a common offset for each unit structure of the plurality of unit structures for adjusting the position of each unit structure of the plurality of unit structures commonly in the second direction based on a difference between the measured intensity of the extreme ultraviolet light that is incident and the measured intensity of the extreme ultraviolet light that is emitted.

9. The semiconductor process apparatus of claim 7, wherein the control unit is configured to determine individual offsets for each unit structure of the plurality of unit structures to individually adjust a position of each unit structure of the plurality of unit structures in the second direction based on a difference between the intensity of the extreme ultraviolet light incident to the optical projection system and the intensity of the extreme ultraviolet light emitted from the optical projection system.

10. The semiconductor process apparatus of claim 1, wherein a total number of the lighting mirrors in the plurality of lighting mirrors is less than a total number of projection mirrors in the plurality of projection mirrors.

11. A semiconductor process apparatus, comprising:
a light source configured to output extreme ultraviolet light within an extreme ultraviolet wavelength band;
a mask stage configured to support a mask that is configured to reflect extreme ultraviolet light in a pattern to result in patterned extreme ultraviolet light;
a substrate stage configured to support a substrate;
an optical lighting system including a first lighting mirror and a second lighting mirror configured to guide the extreme ultraviolet light from the light source to the mask stage, wherein the first lighting mirror includes a plurality of first unit mirrors, a portion of which includes selected first unit mirrors configured to reflect the extreme ultraviolet light; and
a control unit configured to control the light source, the mask stage, the substrate stage, and the optical lighting system,
wherein the control unit is configured to determine a degree of degradation of each first unit mirror in the plurality of first unit mirrors based on the use of each first unit mirror, respectively, select a first group of first unit mirrors disposed in a reflective area for reflecting the extreme ultraviolet light based on the degree of degradation of the first unit mirrors disposed in a reflective area, select a second group of first unit mirrors from a non-reflective area different from the reflective area to replace the first group of first unit mirrors, and to adjust a posture of a third group of the first unit mirrors to use the second group of first unit mirrors.

12. The semiconductor process apparatus of claim 11,
wherein the number of first unit mirrors in the first group of first unit mirrors is equal to the number of first unit mirrors in the second group of first unit mirrors.

13. The semiconductor process apparatus of claim 11, wherein the control unit is configured to determine the degree of degradation based on at least one of a number of times each first unit mirror of the plurality of first unit mirrors is used to reflect extreme ultraviolet light and an accumulated duration of reflecting extreme ultraviolet light of each first unit mirror of the plurality of first unit mirrors.

14. A semiconductor process apparatus, comprising:
a lighting unit configured to output extreme ultraviolet light within an extreme ultraviolet wavelength band;
a mask stage configured to support a mask configured to reflect the extreme ultraviolet light in a pattern to result in patterned extreme ultraviolet light;
a substrate stage configured to support a substrate, wherein the substrate stage is positioned such that patterned extreme ultraviolet light reflected by a mask supported on the mask stage is irradiated to a substrate supported by the substrate stage;
an optical projection system including a plurality of projection mirrors configured to guide the patterned extreme ultraviolet light from the mask stage to the substrate stage;
a first optical detector disposed between the optical projection system and the mask stage and configured to sense the intensity of extreme ultraviolet light incident to the optical projection system;
a second optical detector disposed between the optical projection system and the substrate stage and configured to sense the intensity of extreme ultraviolet light incident to the substrate stage;
an optical intensity adjuster disposed between the optical projection system and the mask stage and configured to adjust an intensity of patterned extreme ultraviolet light that is incident to the optical projection system; and
a control unit configured to control the lighting unit, the mask stage, the substrate stage, and the optical projection system,
wherein the optical intensity adjuster includes a plurality of unit structures, and
wherein the control unit is configured to determine an extreme ultraviolet light loss of the optical projection system based on a first intensity of extreme ultraviolet light measured by the first optical detector and a second intensity of the extreme ultraviolet light measured by the second optical detector in a state in which the plurality of unit structures is initialized.

15. The semiconductor process apparatus of claim 14, wherein the control unit is configured to adjust a position of each of the plurality of unit structures based on a result of a determination of extreme ultraviolet light loss.

16. The semiconductor process apparatus of claim 15, wherein the control unit is configured to determine that a ratio of the intensity of the extreme ultraviolet light emitted by the optical projection system to the intensity of the extreme ultraviolet light incident to the optical projection system is reduced as compared to a predetermined reference value due to extreme ultraviolet light loss, and the control unit is configured to adjust an offset commonly applied to the plurality of unit structures in response to the determination.

17. The semiconductor process apparatus of claim 15, wherein the control unit is configured to determine that a distribution of the intensity of the extreme ultraviolet light emitted by the optical projection system has changed as compared to a predetermined reference distribution due to extreme ultraviolet light loss, and the control unit is configured to individually adjust an offset for each of the unit structures of the plurality of unit structures.

18. The semiconductor process apparatus of claim 14, wherein each of the plurality of projection mirrors includes a mirror body and a reflective layer attached to the mirror body.

19. The semiconductor process apparatus of claim 11, further comprising:

an optical projection system including a plurality of projection mirrors configured to guide the patterned extreme ultraviolet light from the mask stage to the substrate stage;

a first optical detector disposed between the optical projection system and the mask stage and configured to sense the intensity of extreme ultraviolet light incident to the optical projection system;

a second optical detector disposed between the optical projection system and the substrate stage and configured to sense the intensity of extreme ultraviolet light incident to the substrate stage; and an optical intensity adjuster disposed between the mask stage and the optical projection system and configured to adjust the intensity of the patterned extreme ultraviolet light, wherein the control unit is configured to control the optical projection system and to determine an extreme ultraviolet light loss of the optical projection system based on a first intensity of extreme ultraviolet light measured by the first optical detector and a second intensity of the extreme ultraviolet light measured by the second optical detector in a state in which an offset of the optical intensity adjuster is initialized.

* * * * *